United States Patent [19]
Kakuta

[11] Patent Number: 5,621,882
[45] Date of Patent: Apr. 15, 1997

[54] DISK ARRAY SYSTEM AND METHOD OF RENEWING DATA THEREOF

[75] Inventor: Hitoshi Kakuta, Tokyo, Japan

[73] Assignee: Hitachi, Ltd., Tokyo, Japan

[21] Appl. No.: 173,557

[22] Filed: Dec. 22, 1993

[30] Foreign Application Priority Data

Dec. 28, 1992 [JP] Japan ..................... 4-348301

[51] Int. Cl.$^6$ ........................... G06F 11/34
[52] U.S. Cl. ........................... 395/482.04
[58] Field of Search ................. 395/575, 425, 395/725, 182.04; 371/49.1, 48, 49.2, 40.1, 51.1, 10.1, 10.2

[56] References Cited

U.S. PATENT DOCUMENTS

| | | | |
|---|---|---|---|
| 3,568,153 | 3/1971 | Kurtz et al. | 340/146.1 |
| 4,761,785 | 8/1988 | Clark et al. | 371/51 |
| 5,309,451 | 5/1994 | Noya et al. | 371/40.4 |

FOREIGN PATENT DOCUMENTS

| | | |
|---|---|---|
| 4-230512 | 8/1992 | Japan . |
| 9120076 | 12/1991 | WIPO . |

OTHER PUBLICATIONS

Patterson, David A., et al. "A Case for Redundant Arrays of Inexpensive Disks (RAID)," ACM SIGMOD Conference, Chicago, Illinois, Jun. 1988, pp. 109–116. (English).

*Primary Examiner*—Robert W. Beausoliel, Jr.
*Assistant Examiner*—Phung My Chung
*Attorney, Agent, or Firm*—Fay, Sharpe, Beall, Fagan, Minnich & McKee

[57] ABSTRACT

To a parity group including a plurality of data items and a parity code, at least two dummy data items are added to configure a logical group. The data items, dummy data items, and parity code of each logical group are written in mutually different disk drives. When renewing a data item of a parity group, an old data item and an old parity code are read from the associated drives so as to renew the old data item. According to a new data item for the renewal and the old data item and parity code, there is created a new parity code. The new parity code is written in one of the drives containing dummy data items available at an earliest point of time for the write operation. Prior to the write operation of the new parity code, the new data item is written in a drive containing another dummy data item.

8 Claims, 21 Drawing Sheets

FIG. 3A

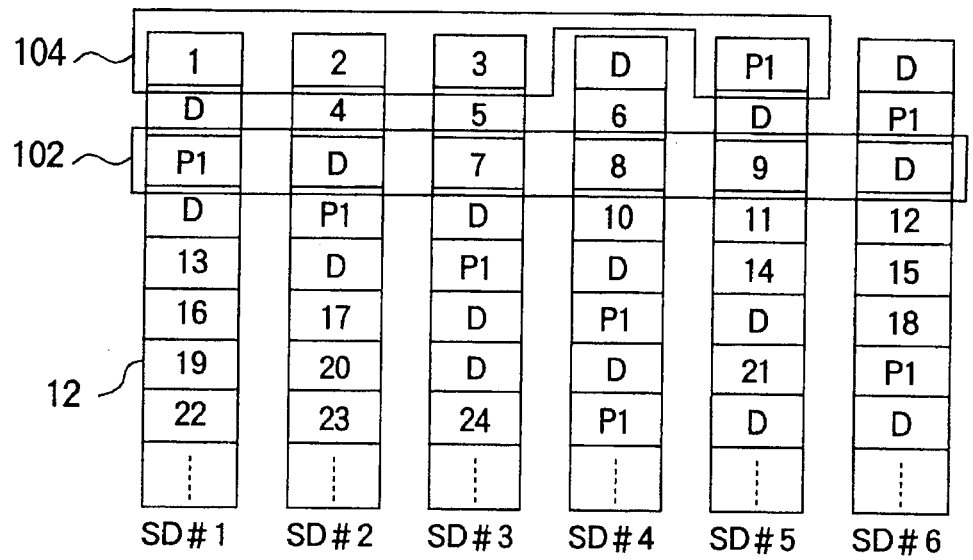

FIG. 3B

| CPU SPECIFI-CATION Drive No. | SCSI DRIVE ADDRESS | | | SCSI DRIVE INFORMATION | | | | | |
|---|---|---|---|---|---|---|---|---|---|
| | | PDrive No. | DDrive No. | SD#1 | SD#2 | SD#3 | SD#4 | SD#5 | SD#6 |
| Drive #1 | DADR1 | SD#5 | SD#4 SD#6 | Data#1 | Data#2 | Data#3 | Dummy | Parity | Dummy |
| | DADR2 | SD#6 | SD#1 SD#5 | Dummy | Data#4 | Data#5 | Data#6 | Dummy | Parity |
| | DADR3 | SD#1 | SD#2 SD#6 | Parity | Dummy | Data#7 | Data#8 | Data#9 | Dummy |
| | DADR4 | SD#2 | SD#1 SD#3 | Dummy | Parity | Dummy | Data#10 | Data#11 | Data#12 |
| | DADR5 | SD#3 | SD#2 SD#4 | Data#13 | Dummy | Parity | Dummy | Data#14 | Data#15 |
| | DADR6 | SD#4 | SD#3 SD#5 | Data#16 | Data#17 | Dummy | Parity | Dummy | Data#18 |
| | DADR7 | SD#6 | SD#3 SD#4 | Data#19 | Data#20 | Dummy | Dummy | Data#21 | Parity |
| | DADR8 | SD#4 | SD#5 SD#6 | Data#22 | Data#23 | Data#24 | Parity | Dummy | Dummy |

| CCHHR | Cache ADDRESS | Cache Flag | INVALIDITY Flag |
|---|---|---|---|
| ADR 8 | C ADR2,1 | 0 | 0 |

PDriver No. : PARITY DRIVE No.
DDriver No. : DUMMY DRIVE No.

FIG. 16
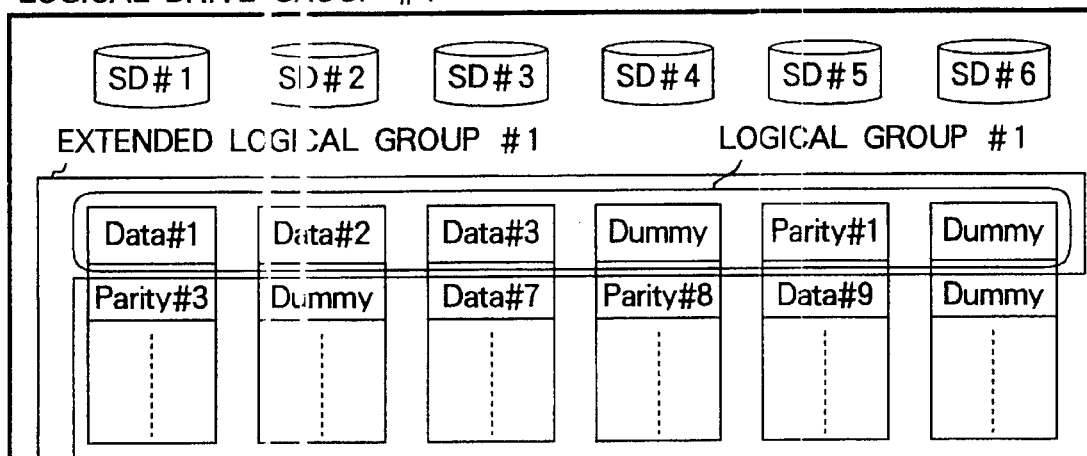
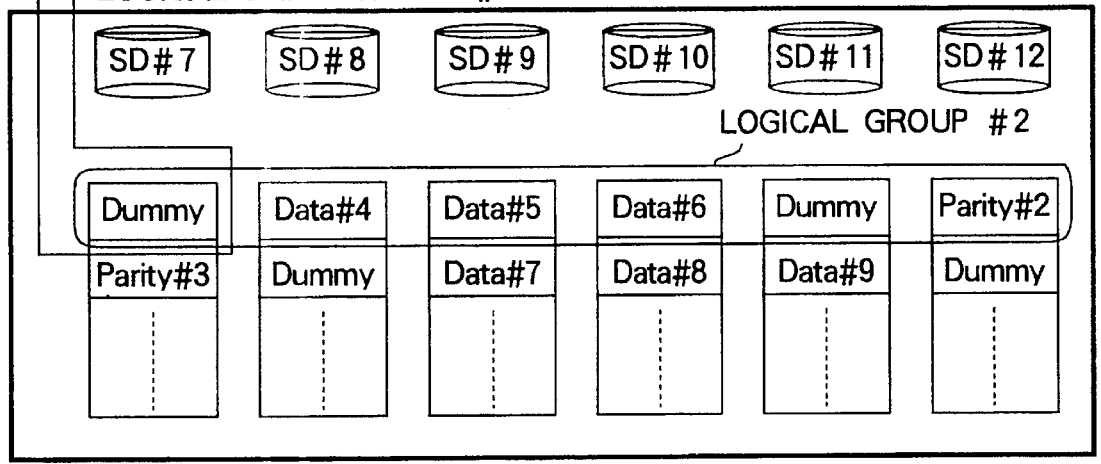
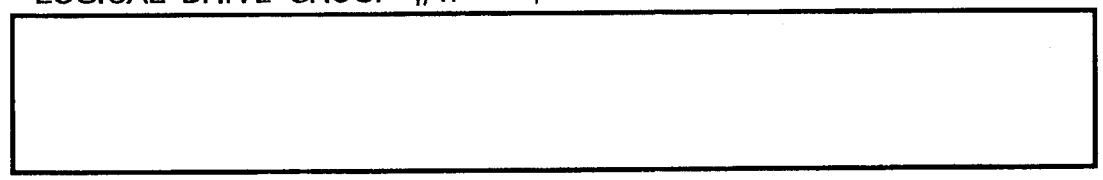

FIG. 16
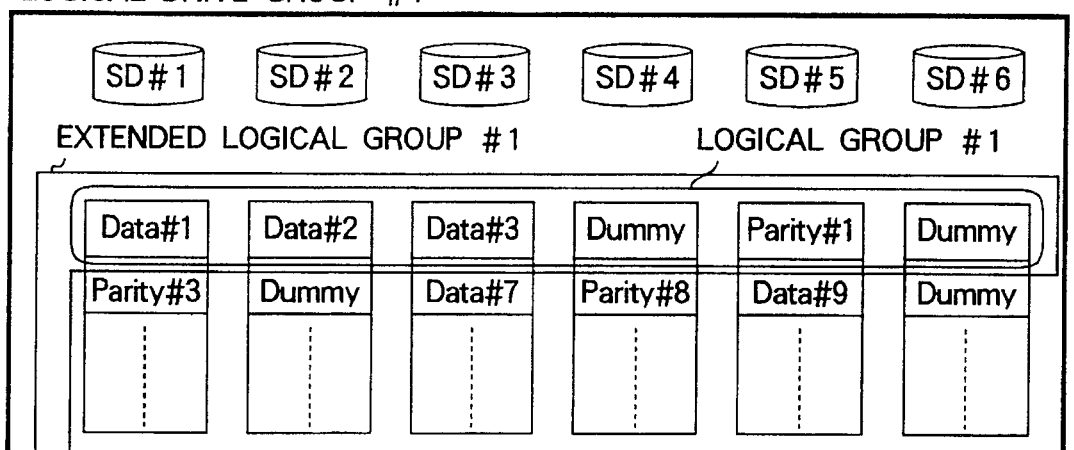
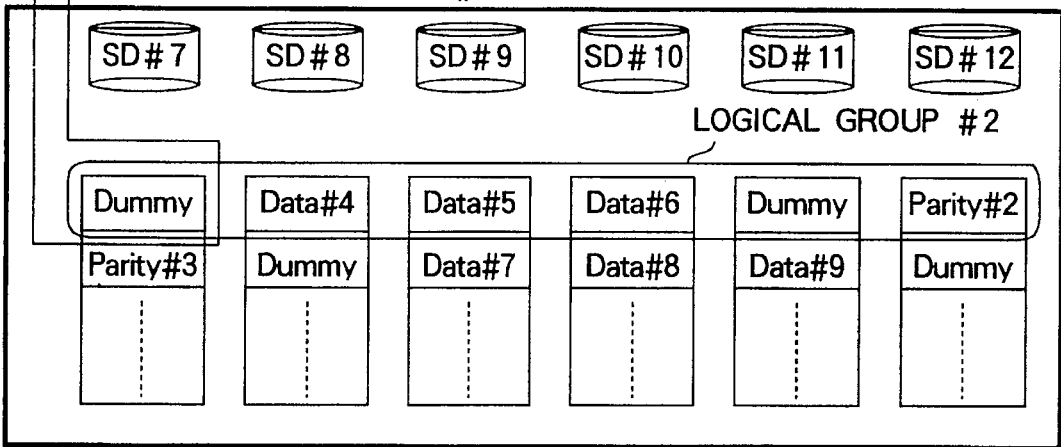
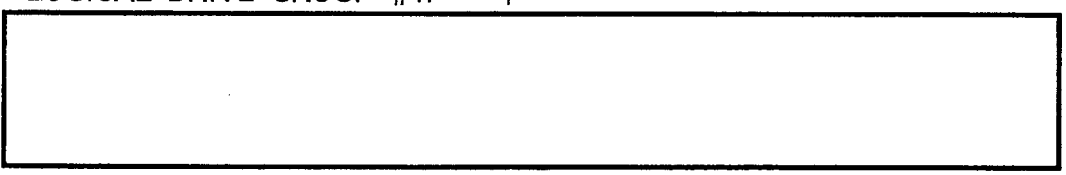

FIG. 20

| CPU SPECIFICATION ADDRESS 41 | | 46 61 | 47 60 48 | |
|---|---|---|---|---|
| CPU SPECI-FICATION Drive No. | CCHHR | LOGICAL GROUP ADDRESS | CACHE ADDRESS | Cache Flag |
| Drive #1 | ADR1 | LADR1 | — | — |
|  | ADR2 | LADR2 | — | — |
|  | ADR3 | LADR8 | — | — |
|  | ⋮ | ⋮ | ⋮ | ⋮ |
| Drive #2 | ADR1 | LADR2 | — | 0 |
|  | ADR2 | LADR1 | CADR1,5 | 1 |
|  | ADR3 | LADR5 | CADR1,8 | 1 |
|  | ADR4 | LADR4 | CADR1,6 | 1 |
|  | ⋮ | ⋮ | ⋮ | ⋮ |

MAGNETIC DISK 12

1

DISK ARRAY SYSTEM AND METHOD OF RENEWING DATA THEREOF

BACKGROUND OF THE INVENTION

The present invention is related to U.S. application Ser. No. 07/979,275 filed on Nov. 20, 1992 and Ser. No. 08/034,389 filed on Mar. 18, 1993, the subject matter of which are herein incorporated by reference.

The present invention relates to a control operation of an disk array system, and in particular, to a data renewal method applicable to a disk array system adopting a level 5 system of Redundant Arrays of Inexpensive Disks (RAID), which will be described in detailed later.

Recent development of information processing requires a secondary storage system to attain high performance in a computer system. As a solution, there has been considered a disk array system including a plurality of disk devices (to be called drives herebelow) each having a relatively small capacity. Such an apparatus has been described in, for example, a thesis of D. Patterson, G. Gibson, and R. H. Kartz "A Case for Redundant Arrays of Inexpensive Disks (RAID)" proposed in ACM SIGMOD Conference, Chicago, Ill, (June, 1988).

In the article, there has been reported results of discussion on performance and reliability of disk arrays (level 3) in which data is subdivided for concurrent operations thereof and disk arrays (level 5) in which data is distributed for independent processing thereof.

Description will next be given of the level 5 disk array system in which distributed data is independently handled. In the level 5 system, each data item is not subdivided but is independently treated such that data items are distributed to be stored or written in a large number of disk drives each having a relatively small capacity. In a secondary storage apparatus of a mainframe system commonly used at present, each drive has a large capacity. Consequently, there frequently appears a case where a read/write request is issued to a drive while the drive is being occupied for another read/write request and hence the pertinent processing is obliged to enter a wait state due to the unavailable drive.

In a system of disk arrays of this type, the large-capacity drive used as the secondary storage of a mainframe computer system is replaced with many drives each having a small capacity such that data is distributed to be stored therein. Consequently, even when the number of data read and write requests is increased, such input and output requests can be distributed to the plural drives of the disk array system to achieve processing, thereby minimizing the chance in which processing enters the wait state for read and write requests due to unavailable drives. However, since a disk array includes many drives, the total number of constituent parts thereof and hence probability of occurrences of failures are increased. To cope therewith, namely, to improve reliability of the array system, a parity check is conducted in the data read and write operations.

FIG. 21 illustratively shows a data control procedure of the RAID proposed by D. Patterson et al. in the above thesis. There are shown internal data addresses of each drive in a level 5 disk array in which each data is distributed to a plurality of disk drives and the respective drives are handled independently of each other. Data items at the respective addresses form a unit of processing to be carried out for each read or write operation. In the processing, the groups of data items are handles independently of each other. Moreover, according to an architecture described in the article of RAID, the address is fixed for each data.

In this system, as already described above, it is indispensable to employ the parity check to improve reliability of the system. In the system, the parity data is created according to data at an identical address of each drive. Namely, the parity data is produced according to four data items at the same address (2,2) of the respective drives #1 to #4 and is then written at the address (2,2) of the drive #5 assigned for the parity storage. In this connection, according to the level 5 RAID, the parity data of all data is not necessarily stored in the drive #5. That is, for distributing each data, there are assigned a plurality of drives for the data and a drive for the parity code.

In the system, as in the mainframe system commonly used today, when conducting a data read or write operation for data of a drive, an access is made to the drive with specification of a physical address at which the data is written in the drive. Namely, as shown in FIG. 22, the physical address identifies a cylinder position to which a track in which the data is stored belongs, a position of the track in the cylinder, namely, a disk surface, and a position of the record in the track. Specifically, the address is represented with a (drive) number of the pertinent drive 12 in which the requested data is stored and CCHHR including a cylinder address (CC) denoting a cylinder number in the drive, a head address (HH) indicating a number assigned to a head 140 to select a track in the cylinder, and a record address (R).

In a disk array structured as above, in a case where a renewal or an update operation is desired to be conducted for data stored, for example, at an address (2,2) of the drive #3 shown in FIG. 21, there are conducted read operations for before-update or old data at the address (2,2) of the drive#3 and old parity data at the address (2,2) of the drive #5 assigned to store therein parity data related to the pertinent data (step (1)). These data items are exclusive-ORed with new data to produce new parity data (step (2)). After the parity data creation, the new data for the renewal is written at the address (2,2) of the drive #3 and the new parity data is stored at the address (2,2) of the drive #5 (step (3)).

As above, in the disk array, parity data is generated from the pertinent data such that the parity data is written in a drive in the same fashion as for the data. In this operation, however, the parity data is written in a drive other than the drivein which the data associated therewith is stored. As a result, at an occurrence of a failure in the drive in which the data is written, it is possible to rebuild or restore the data stored therein.

In the disk array system, like in the mainframe system commonly used at present, a storage location (address) of each data is beforehand fixed in the secondary storage system. Namely, when reading or writing data from or in the storage, the CPU accesses an address assigned to the data in advance.

In a level 5 disk array configuration, as shown in FIG. 23, in order to read old data and old parity data from drives respectively related thereto, there is necessitated a wait time of a disk latency, namely, a half period of time for one disk rotation. After the old data and the old parity data are read therefrom, new parity data is created. To write the new parity data in the drive, there is required a disk latency of one disk rotation. Resultantly, a total of the disk latency of 1.5 rotations of the disk is to be elapsed, which is quite a considerable overhead time.

To decrease the overhead time in the data write operation, there has been proposed in WO 91/20076 filed by the STK Corporation a dynamic mapping method of dynamically mapping or translating, after the data renewal, address information of a group (to be called a parity group) including other data parity data each having an address equal to that of the renewed data.

On the other hand, in the JP-A-4-230512, there has been described a renewal and recording method and a renewal and recording apparatus for use with direct access storage device (DASD) arrays. According to the method, a data block and a parity block of each parity group are distributed to the DASD arrays in a format which is not influenced from failures. Moreover, in each drive, there is reserved a free space or an unused space to be shared among a plurality of logical groups. In a first cycle, the old data block and the old parity block are read from the arrays. Based on the data and new data for renewal, there is computed parity data. In the unused space in which the old data and the old parity data have been held, the new data and the new parity block are stored through a shadow write operation.

However, when conducting the dynamic mapping described in WO 91/20076, there arise the following problems.

(1) When the dynamic mapping is carried out, an area in which the old parity group is memorized is remained as a space not to be used in the drive. Consequently, when it is desired to perform a dynamic mapping, there possibly occurs a disadvantageous case where it is impossible to reserve a new storage area for the dynamic mapping.

(2) When address information is controlled in the form of a table, the capacity of the table is increased, which increases the cost of the memory. Moreover, the address control operation is complicated and hence the processing overhead time is increased.

On the other hand, according to the method of the JP-A-4-230512 employing the unused space, the problem (1) cannot be considered to take place. However, as for the address control operation of Item (2) above, there has not been clearly described a method associated therewith. Furthermore, description has not been given of countermeasures to cope with increase in the number of drives and occurrence of a failure in the system.

SUMMARY OF THE INVENTION

It is therefore an object of the present invention to provide a data write method capable of increasing a write speed when renewing data in a disk array system.

Another object of the present invention to provide a data write method for use with a disk array system capable of coping with a case where a new device is additionally installed in the system and a case where a failure occurs in the system.

According to the present invention, there are disposed a group of drives constituting a parity group including a plurality of data items and at least an error correcting code (e.g., a parity code) and a group of drives for a plurality of backup write areas of (dummy) data items. These groups form a logical group. In the drives of the logical group, there are stored a plurality of data items, a parity data item, and a plurality of dummy data items. In operation, these items are treated independently of each other. According to a feature of the present invention, the combination of the groups of drives constituting a before-write logical group prior to the write operation of renewal data is different from that of the groups posterior thereto.

That is, a drive in which the renewal data is to be written and a drive in which new parity data after the write operation is to be stored are selected from the drives (to be called dummy drives) having a plurality of dummy data items in such a fashion that the disk latency is minimized in consideration of the overall write processing to increase the processing efficiency.

After the drives are determined respectively for the new parity code and the new data, when the drive for the new data is set to the operative state for the write operation, the new data is immediately written therein. The old data is the old parity data are then read from the old group of drives so as to produce a new parity code after the write operation according to the old data, the old parity code, and the new data to be written. The new data and the new parity code are then written in the drives determined in advance. After the new data and the new parity code are thus stored therein, the drive in which the old data is written and the drive in which the old parity code is stored are assigned as (dummy) drives for storage of dummy data items.

According to another aspect of the present invention, for each logical group, a drive in which (new) write data is to be written is decided in accordance with information of disk rotational positions and information of disk latency. Namely, from a plurality of dummy drives storing therein dummy data items, there is selected a dummy drive, a dummy data item thereof, and a physical address in the items as a storage location of the new data.

According to another aspect of the present invention, at an occurrence of a failure in a drive of a logical group, there is conducted a control operation to rebuild data and/or parity data in the drive according to normal data items and parity codes in the other drives through a data recovery processing so as to write the restored data and/or parity data at predetermined addresses of dummy drives associated therewith.

According to the present invention, a plurality of data items and a parity code constituting a parity group and a plurality of dummy data items are stored in mutually independent drives.

In consequence, the renewal data and the new parity code after a write operation of the renewal data can be written in the group of drives storing therein dummy data items. This enables the new parity code after the write operation to be written in a drive necessitating the minimum latency. Consequently, the write operation of the parity code can be efficiently accomplished. In the conventional disk array system, there has been necessitated an average latency of 1.5 disk rotations for the parity code write operation. In contrast therewith, the average latency is reduced to one disk rotation in the present invention.

Furthermore, since it is guaranteed in the configuration that the plural dummy data areas are reserved in the drives other than those assigned to the data and the parity code, the address control operation for additional drives and the recovery processing for an occurrence of a failure can be facilitated.

BRIEF DESCRIPTION OF THE DRAWINGS

These and other objects and advantages of the present invention will become apparent by reference to the following description and accompanying drawings wherein:

FIGS. 3A and 3B are explanatory diagrams showing address mapping tables;

FIG. 16 is a diagram for explaining a logical group in a fourth embodiment according to the present invention;

FIG. 17 is a diagram showing the system construction in a fifth embodiment according to the present invention;

FIG. 20 is a diagram for explaining a logical group table of the fifth embodiment;

DESCRIPTION OF THE PREFERRED EMBODIMENTS

Figure 1:
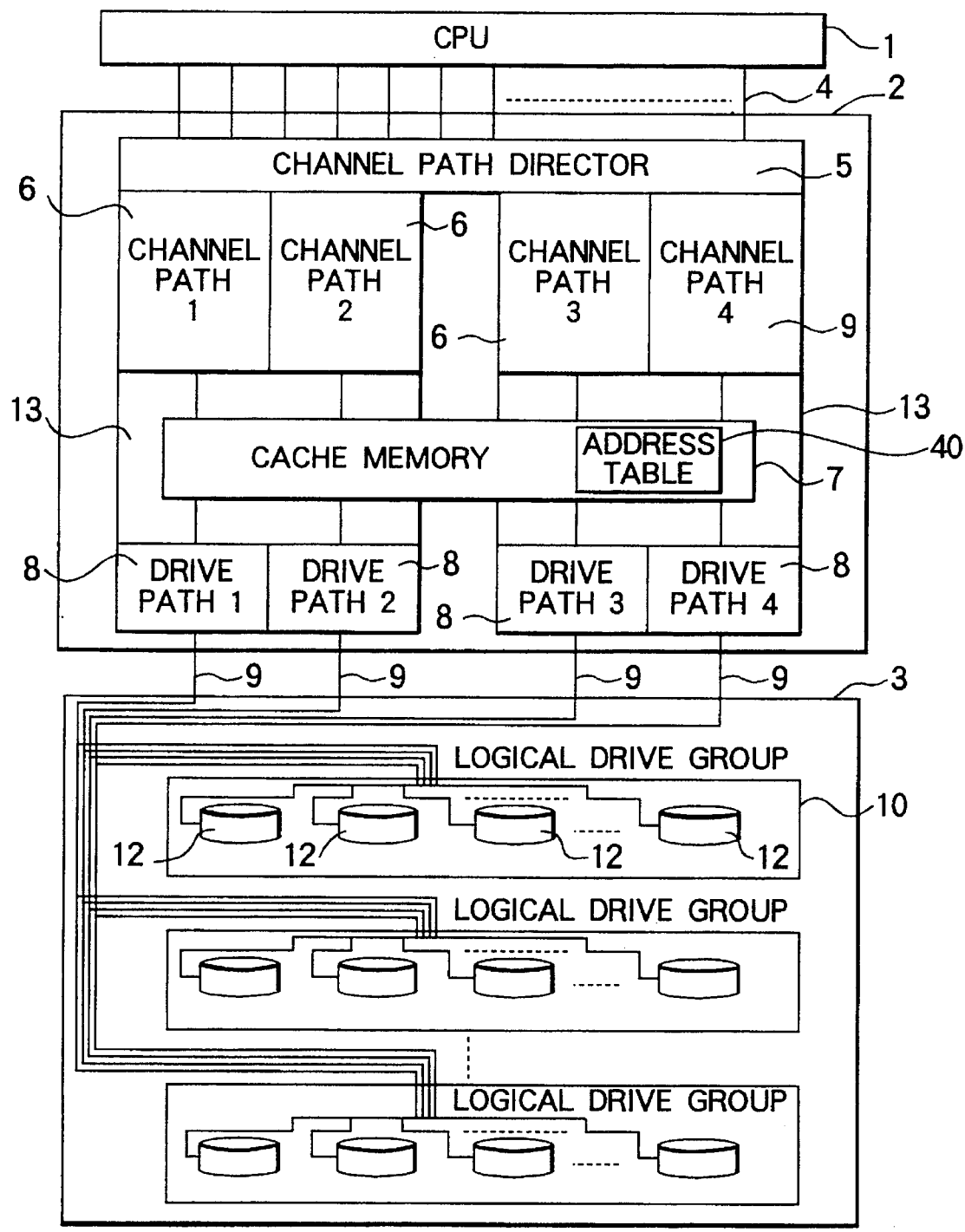
FIG. 1 is a diagram showing the overall configuration of a first embodiment according to the present invention.

Referring now to FIG. 1, description will be given of an embodiment according to the present invention.

The embodiment includes a central processing unit (CPU) 1, an array disk controller (ADC) 2, and an array disk unit (ADU) 3. The ADU 3 includes a plurality of logical drive groups 10 each including m small computer system interface (SCSI) drives 12 using magnetic recording media and four drive paths 9 connecting the respective SCSi drives 12 to the ADC 2. In this regard, to develop the effect of the present invention, although the number of the drives 12 is not limited, it is only necessary to dispose only four or more SCSI drives.

The logical drive group 10 is a failure recovery unit. When a failure occurs in either one of the drives belonging to the group 10, data of the failed drive is restored according to data of the other drives of the group 10.

In the conventional disk arrays of RAID level 5, each logical drive group includes drives to store therein a plurality of data items distributed thereto and drives to store therein a parity code generated from the data items. A combination of the data items and the parity code is called a parity group. Consequently, the number of drives used for each logical drive group is obtained by adding one to the number (N) of data items to be distributed for storage thereof.

In the RAID level 5, each drive is a data storage drive or a parity storage drive. However, in accordance with the embodiment, each logical drive group includes at least N+3 drives. Consequently, m=N+3. Two drives added in this configuration are used to provide spare (dummy data) areas for the later renewal of data in the same parity group. This is an aspect of the embodiment.

For example, as shown in FIG. 3A, in a case where SCSI drives #1 to #6 constitute a logical drive group, a first parity group including data items 1 to 3 and a parity code P1 is written respectively in the drives #1 to #3 and the drive #5. Moreover, for the first parity group, dummy areas are allocated as spare spaces in the drives #4 and #6. According to an aspect of this embodiment, these dummy areas are used to minimize the disk latency in a data renewal operation. Namely, when renewing or updating data, for example, data 1 in the parity group, the data 1 and a parity code P1 are read from the disk array system, which will be described later. Using these items and renewal data, a new parity code is created. The code and the renewal data are then written in the dummy areas respectively of the drives #4 and #6, which are different from those storing the old data 1 and the old parity code P1.

Two areas respectively holding the old data 1 and the old parity code P1 are thereafter assigned as new dummy areas for the new parity group. Details of the embodiment will now be described.

In this connection, although an example adopting a parity code will be described in conjunction with the following embodiments, it is naturally possible to replace the parity code with another hamming code or error correction code.

Subsequently, the internal construction of the ADC 2 will be described by reference to FIG. 1. The ADC 2 includes a channel path director 5, two clusters 13, and a cache memory 7 which is a semiconductor memory operated as an nonvolatile memory with a backup battery or the like. The director 5 receives a command issued from the CPU 1. In the memory 7, there are written data which has been written in a drive 12 or which has been read therefrom and a mapping table 40 (FIG. 3B) for address translation. The memory 7 and the table 40 are shared among the clusters in the ADC 2. A cluster 13 is a set of paths independently operable in the ACD 2. Each cluster 13 has its own power source and circuit. In the cluster 13, there are disposed two channel paths 6 between the director 5 and the memory 7 and two drive paths 8 between the memory 7 and the SCSI drives 12. Namely, two channel paths 6 and two drive paths 8 are arranged in each cluster 13.

The channel paths 6 are linked with the associated drive paths 8 via the memory 7. A command issued from the CPU 1 is sent via an external interface path 4 to the channel path director 5 of the ADC 2. In the embodiment, the ADC 2 includes two clusters 13 each having two channel paths. Consequently, the ADC 2 includes a total of four channel paths. This means that it is possible for the ADC 2 to accept up to four commands from the CPU 1 at the same time.

Figure 2:
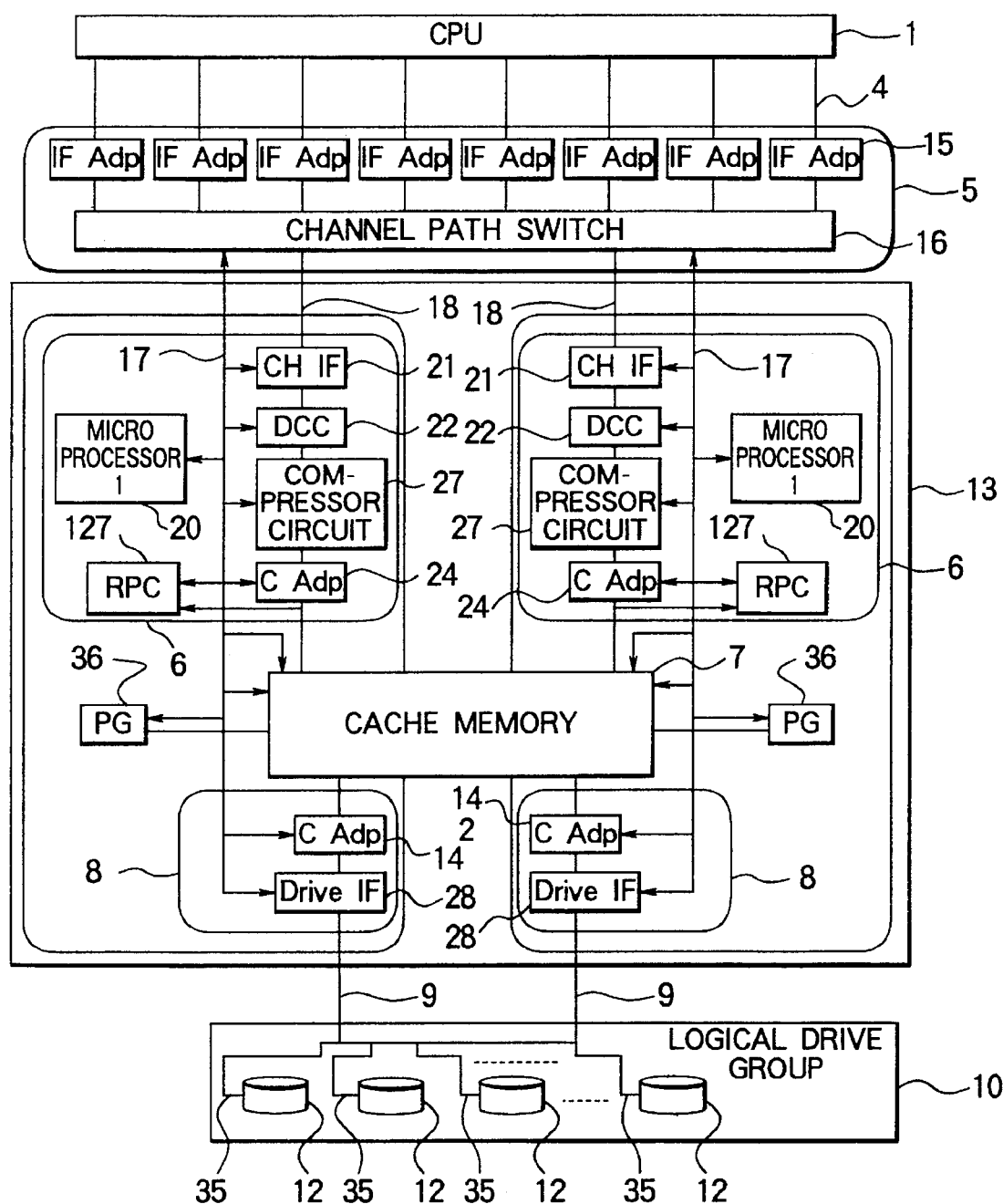
FIG. 2 is a diagram showing the internal structure of a cluster of the first embodiment.

FIG. 2 shows the internal constitution of the the director 5 and the cluster 13 of FIG. 1. As can be seen from this diagram, a command issued from the CPU 1 is sent via the path 4 to the ADC 2 and is then received by one of the interface adapters (IF Adp) 15 in the director 5. A microprocessor (MP) 20 in each path 6 checks to decides whether or not there exists a path 4 having acquired a command. If such a path 4 is recognized, the microprocessor 20 causes a channel path switch 16 to conduct a change-over operation to receive the command obtained by the path 4. If the command is unacceptable, the processor 20 sends a response of unacceptability to the CPU 1. In this diagram, numerals 17 and 18 denote signal lines and data paths, respectively.

Numeral 24 denotes a cache adapter circuit (C Adp) to read or write data from or in the cache memory 7 in response to an associated indication from the processor 20. The circuit 24 monitors states of the memory 7 and carries out an exclusive control operation for each read or write request. Data attained by the circuit 24 is transferred under control of a data control circuit (DCC) 22 to a channel interface circuit (CH IF) 21. In the circuit 21, the data is transformed according to a protocol of a channel interface of the CPU 1, thereby adjusting the transfer speed for the channel interface. Numeral 27 designates a circuit to compress data. Numeral 28 stands for a drive interface which issues a read command to the drive unit path 9 according to a read processing procedure of the SCSI. In the circuit 28, the received data is transferred to a cache adapter (C Adp) circuit 14 on the SCSI drive side, thereby writing the data in the memory 7. Numeral 35 indicates a data path, whereas a numeral 36 denotes a parity generator circuit to create a parity code according to data of the memory 7 and then writes the code therein. Numeral 127 designates a circuit to sense a disk rotational position.

In this embodiment in which a level-5 disk array system is implemented, data items specified by a plurality of input/output (I/O) commands from the CPU 1 are collected to produce data belonging to a parity group such that these data items are written in an identical logical drive group under control of either one of the processors 20. In the following paragraphs, for simplification of description, it is assumed that an identical drive number (41 of FIG. 3B) is specified by the I/O commands from the CPU 1. In operation, parity codes respectively related thereto are created also by the processor 20. The parity codes are assumed to belong to the parity group and hence are written in other SCSI drives belonging to the same logical drive group.

FIGS. 3A and 3B show how the data items belonging to a parity group are written in drives in a case where a logical drive group includes six SCSI drives. In this example, three kinds of data items belong to a parity group, and these data items and a parity code created therefrom constitute a parity group. Moreover, for the group, there are reserved two dummy areas. These areas are allocated to mutually different drives. Namely, the logical drive group includes drives for the parity group and those for the dummy data.

When data of the parity group is first written in the system, the processor 20 makes a search through available areas having an identical inter-drive address in several logical drive groups to reserve the three data items, the parity code, and two dummy data areas in different drives. In this operation, information items related to addresses of the reserved areas are written in the mapping or address translation table (FIG. 3B), which will be described later.

The write operation is different from that of the conventional technology in that there are reserved, when a parity group is first written in the logical drive, at least two dummy areas for data of the parity group. Moreover, it is to be noted that the two dummy areas are reserved in two different dummy drives.

In this embodiment, as the SCSI drives 12 constituting the ADU 3, there are used drives of the SCSI interface. In a case where a mainframe computer like a computer of the IBM system 9000 series is adopted as the CPU 1, the CPU 1 issues commands conforming to the system of commands associated with the channel interface operable under control of an IBM operating system (OS). In this situation, when drives of the SCSI interface are employed as the SCSI drives 12, the command issued from the CPU 1 is required to be converted into a command conforming to the command system related to the SCSI interface. The command conversion primarily includes a protocol conversion of the command and an address translation thereof. The address translation or mapping will now be described.

An address specified by the CPU 1 includes a (drive) number of the pertinent drive 12 in which the objective data is stored and CCHHR including a cylinder address (CC) indicating a cylinder number in the drive, a head address (HH) denoting a number assigned to a head 140 to select a track in the cylinder, and a record address (R).

In a conventional magnetic disk subsystem (for example, IBM 3990-3390) employing the CKD format, it is only necessary to access the drive according to the address.

in the embodiment, however, using the plural SCSI drives 12, the conventional magnetic disk subsystem associated with the CKD format is logically emulated. Namely, the plural SCSI drives 12 are emulated by the ADC 2. For the CPU 1, the drives 12 seem to be a drive used in the the conventional magnetic disk subsystem associated with the CKD format. Consequently, the address (CCHHR) specified by the CPU 1 is converted by the processor 20 into an address of an SCSI drive.

For the address translation, there is utilized an address conversion table 40 (to be called an address table herebelow) as shown in FIG. 3B. The table 40 is stored in an appropriate area of the memory 7 in the ADC 2. In the embodiment, a drive specified by the CPU 1 is an individual drive conforming to the CKD format. However, according to the present invention, the drive which is regarded as a single unit by the CPU 1 actually includes a plurality of SCSI drives. Consequently, for the pertinent drive, there is defined a logical drive group. In consequence, according to the address (i.e., the drive number 41 and CCHHR 46) specified by the CPU 1, the processor 20 of the ACD 2 configures a logical drive group. Namely, for each SCSI drive, the address is translated into an SCSI drive number and an address (intra-SCSI Addr) in the SCSI drive.

As shown in FIG. 1, a plurality of logical drive groups can be configured in the embodiment. The table 40 is created for each logical drive group. FIG. 3B shows an address table related to a logical drive group on assumption that the logical drive group includes the SCSI drives #1 to #6 as shown in FIG. 3A.

The table 40 includes a CPU specification drive no. column 41, an SCSI drive address column 42, and an SCSI drive information column 43. In an identical row of these columns, there are memorized information items belonging to an identical parity group. Each row of the column 42 includes a field 44 to store therein an intra-SCSI drive address where a data item or a parity code is actually stored in the drive, a field 50 to store therein a (parity drive) number of an SCSI drive where a parity code is stored, and a field 51 to store therein a (dummy drive) number of an SCSI drive in which dummy data is stored. A set of parity data and dummy data in the same row of the information 43 is called a logical group 102.

Each row of the column 43 includes fields respectively corresponding to the SCSI drives belonging to an identical logical drive group. The field includes such information items specified by the CPU 1 for data held in the drive as an intra-drive address CCHHR, an address 47 of the data in the memory 7 when the data in the SCSI drive exists also therein, a cache flag which is set to "ON (1)" when the data is memorized in the memory 7, and an invalidity flag 49 which is set to "ON (1)" when dummy data is stored in the drive. In this regard, there are shown in FIG. 3B data items or parity codes to be held as entries of the respective fields of the column 43 in association with the drive allocation of FIG. 3B.

For a drive, when the fields 50 and 51 are empty in the information items memorized in the table 40, it is recognized that the drive is assigned to store data therein. In a row of the table 40, data items are written in the respective fields thereof when a parity group 104 associated therewith is first written in a logical group. Thereafter, when an I/O command renewing data in either one of the parity groups 104 is executed, information items belonging to a row of the table 40 related to the parity group are updated by the processor 20.

As for the table 40, it is a feature of the embodiment that dummy drive numbers are held therein. These numbers are used in a data renewal operation, which will be described later. The table 40 thus constructed is utilized by the processor 20 each time the CPU 1 accesses data in a logical drive.

For example, when the CPU 1 issues a request for data with specifications of the CPU specification drive no.= "Drive #1" and CCHHR="ADR8" in the example of FIG. 3B, the table 40 is checked to examine the entries of the column 43 in a row corresponding to the drive #1, thereby detecting an entry containing "ADRS" for CCHHR. In the example of FIG. 3B, CCHHR of a data #23 is "ADR8" and hence data #23 is identified as the requested data. In the same row, "DADR8" of the intra-SCSI address in the drive #2 indicates a physical address of the data #23. As a result, there is achieved an address translation to obtain the physical address according to the table 42.

After the address translation, the processor 20 issues a read or write request for the data #23 of the drive 12 denoted by SD #2. In this case, since the cache flag 48 of the data #23 is "OFF (0)" in the table 40, the data is missing in C ADR2, 1 in the memory 7. If the flag 48 is "ON (1)", the pertinent data exists in the memory 7. Consequently, the read or write operation is not effected for the drive 12, namely, the requested operation is achieved for the data in the memory 7. Furthermore, since the invalidity flag 49 is "OFF (0)" for the data, it is recognized that the data is other than dummy data.

Next, description will be given of a specific I/O processing in the ADC 2 by reference to FIGS. 1 and 2.

A command issued from the CPU 1 is sent via the IF adapter 15 to the ADC 2 and is then decoded by the processor 20 to be a read or write request.

First, a write request is processed as follows. In this connection, however, description will be given of a data write operation to renew data written in a drive in advance.

Assume that a data renewal command containing specifications of the CPU specification drive number="Drive #1" and CCHHR="ADR8" is issued from the CPU 1. On receiving the command from the CPU 1, the processor 20 of the ADC 2 checks to determine whether or not the command can be processed through the respective channel paths 6 in the cluster 13 to which the processor 20 having received the command belongs. If the processing is possible, a response notifying the possibility is returned to the CPU 1. After receiving the response, the CPU 1 transfers the write data to the ADC 2. Prior to the data transfer, in the channel path director 5 of the ADC 2, the channel path switch 16 connects the channel path 6 to the external interface path 4 and the adapter 15 related to the transfer of the command, thereby establishing a connection between the CPU 1 and the ADC 2.

Write data (to be referred to as new data herebelow) transferred from the CPU 1 is subjected to a protocol conversion by the channel interface 21 in response to an indication from the processor 20. The resultant data then undergoes a speed adjustment between the transfer speed of the path 4 and the processing speed of the DC 2. After the conversion and the adjustment are completed in the interface 21, the data is transferred under control of the DCC 22 to the adapter 24 to be written in the memory 7 by the adapter 24. In this operation, when information transmitted from the CPU 1 is a CPU specification address, an address translation is conducted for the address information according to the table 40 like in the case of the data read operation, thereby attaining a physical address. Furthermore, when the information is data, a physical address obtained by converting an address where the data is written in the memory 7 is registered to the memory 7. Thereafter, a cache flag 48 associated therewith is set to "ON (1)".

On recognizing an event that the new data has been stored in the memory 7 in this manner, the processor 20 reports the termination of the write operation to the CPU 1.

In this connection, when another write request is further issued from the CPU 1 for the new data item held in the memory 7, the new data memorized in the memory 7 is rewritten.

After the new data is written in the memory 7, a parity code related thereto is renewed as above and then the new data and the new parity code are stored in the pertinent SCSI drives 12 in the logical drive group 10.

Returning to FIG. 2, by referencing the address table 40, the processor 20 recognizes SCSI drive numbers assigned to the drives in which the data, the dummy data, and the parity code are written.

The processor 20 indicates the interface circuit 28 to carry out write operations in the pertinent drives 12.

The write processing includes an operation to actually write the new data in the logical drive group 10 and an operation to create a new parity code (to be referred to as new parity herebelow) in association with the write operation of the new data. The creation of the new parity code includes an operation to read from drives 12 before-write (old) data and a before-write (old) parity code for the parity code creation so as to generate a new parity code and an operation to write the new data and the new parity code in the drives 12.

Figure 4:
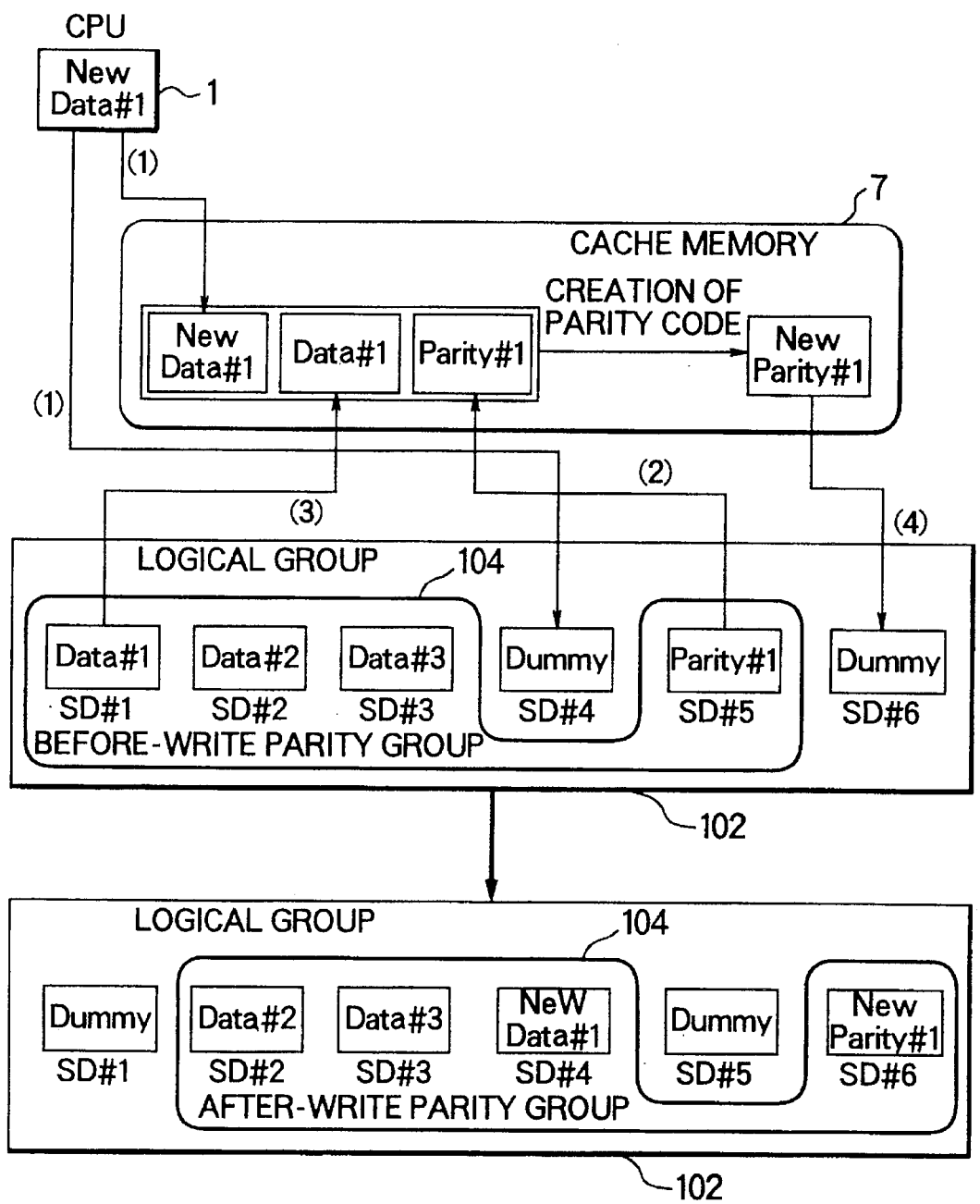
FIG. 4 is a diagram for explaining movement of data in a data renewal operation.

In a case where a write request is issued as shown in FIG. 4 from the CPU 1 for data #1 of the drive 12 denoted as SD #1, the processor 20 attempts to obtain a utilization right for the drive SD #1, the drives SD #$ and SD #6 in which dummy data is stored, and the drive SD #5 in which the parity code is written.

Figure 5:
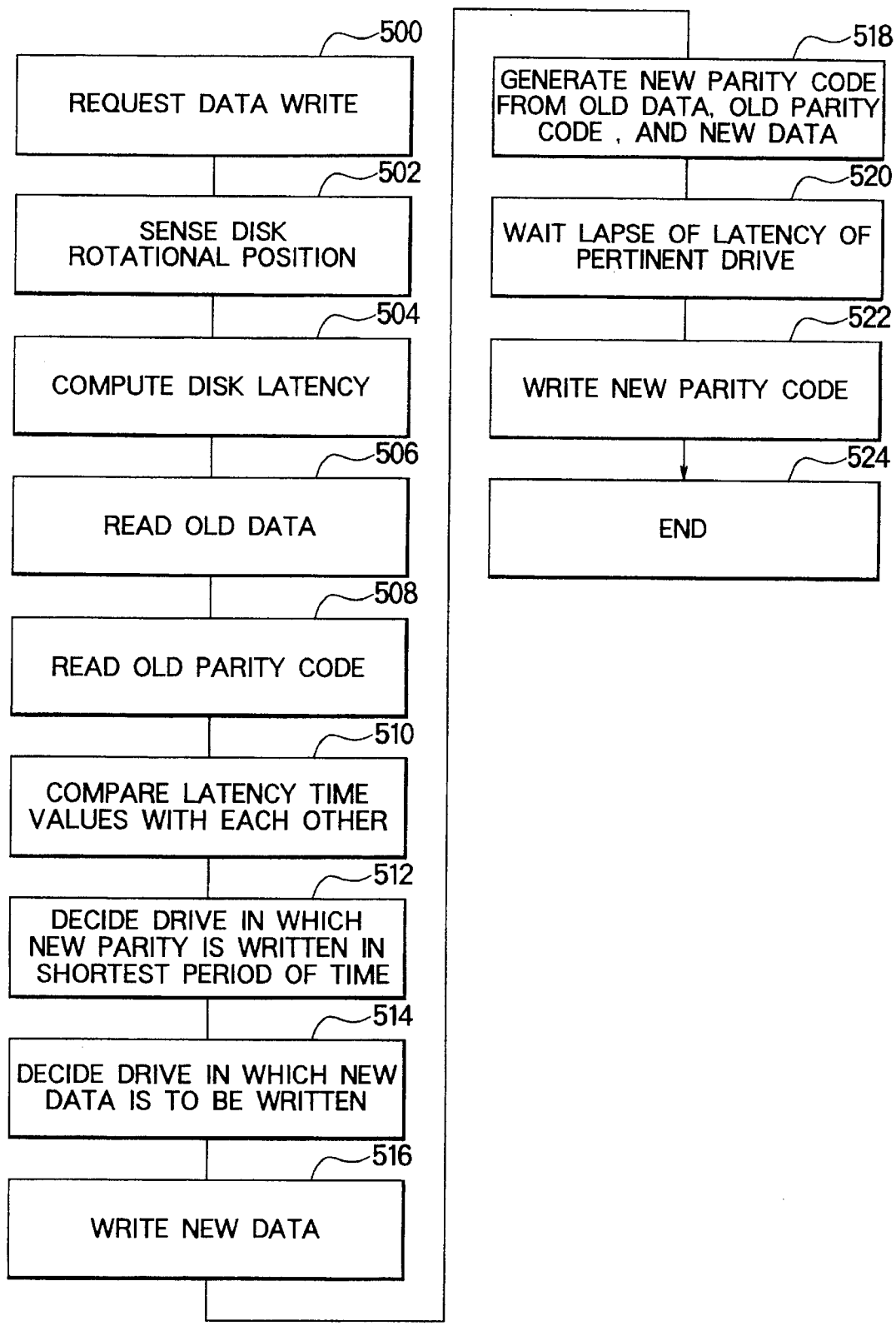
FIG. 5 is a flowchart showing a data renewal processing.

Thereafter, the system carries out processing as shown in the flowchart of FIG. 5. First, the processor 20 detects by the rotational position sensing circuit (RPC) 127 a disk rotational position in each of the drives SD#1, SD#4, SD#5, and SD#6 (step 502). After the positions are detected by the circuit 127, the processor 20 computes disk latency for each drive (step 504).

Figure 6:
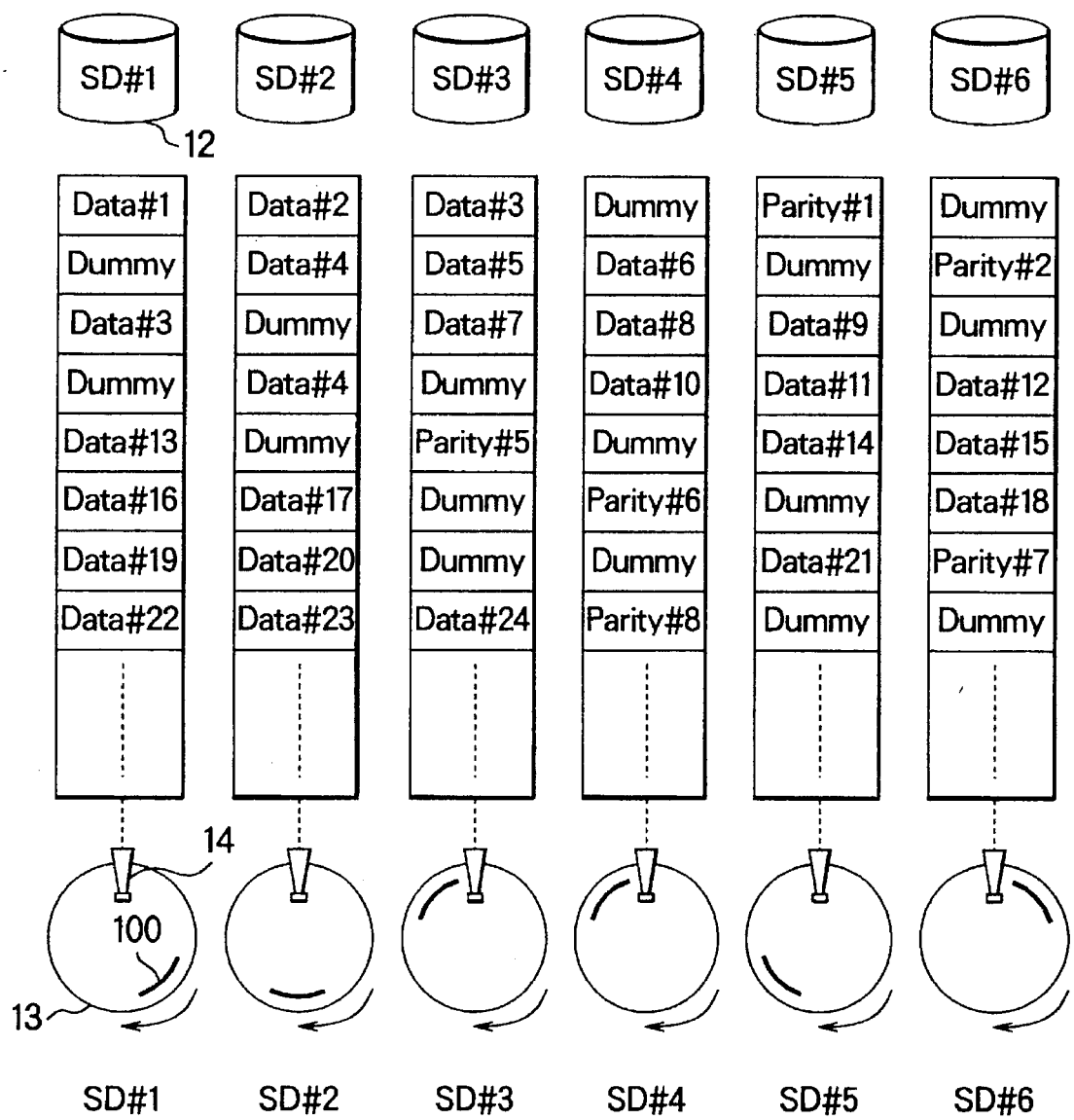
FIG. 6 is a diagram useful to explain positions of data items forming a parity group on disks.

As shown in FIG. 6, in the drives SD#1 to SD#6 constituting the logical drive group 10, there have been written old data (data #1 to data #3), dummy data (dummy), and an old parity code (parity #1). Data 100 in the group 10 exists on disks 130 as shown in the lower portion of FIG. 6. Namely, the period of time which is elapsed by when the data 100 passes a position beneath a head 140 varies between the drives SD#1 to SD#6. The wait time to be elapsed for the rotation of the disk 130 is called latency (TW).

After the latency TW is computed, there are determined SCSI drives for storages respectively of the new parity code and the new data as follows. As can be seen from the flowchart of FIG. 5, the processor 20 first decides which one of the drives respectively storing therein the old data and the old parity code has a larger latency (TW) (steps 506 to 510).

Figure 7A:
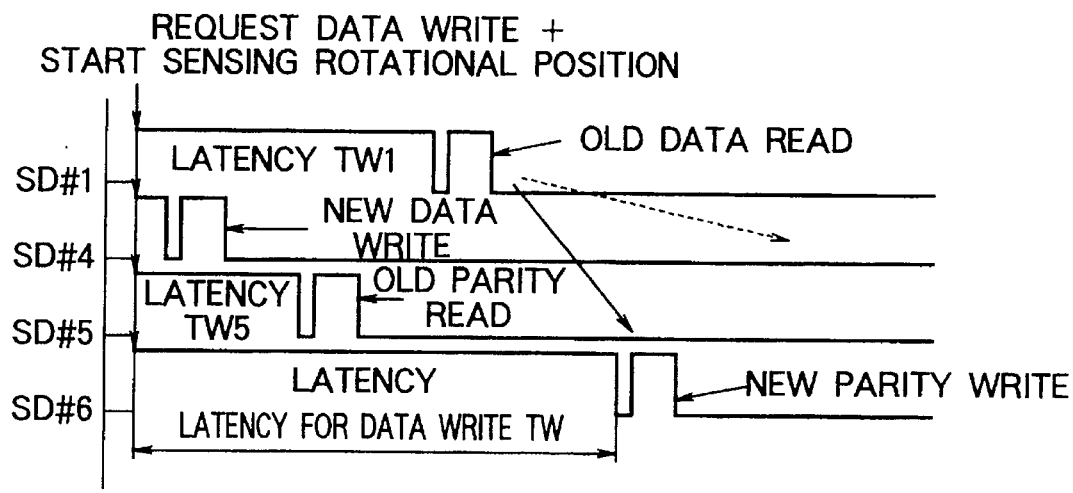
FIGS. 7A and 7B are signal timing charts showing a data renewal operation.

In the example of FIG. 7A, the latency TW1 of the drive SD #1 of the old data is greater than the latency TW5 of the drive SD#5 of the old parity code. Consequently, selecting the drive SD#1 as the reference drive, the processor 20 determines drives in which the new data and the new parity code are written, respectively. Specifically, according to information from the circuit 127, the processor 20 makes a check for the drives SD#4 and SD#6 in which dummy data items are stored to select either one thereof in which a new parity code created after the old data is read from the drive SD#1 (step 506) before the write operation can be written at an earlier point of time. It is thereby determined that the new parity code is written in the selected drive (step 512). On the other hand, the processor 20 decides that the new data is written in the remaining drives of dummy data (step 514). In this fashion, the processor determines the SCSI drives 12 in which the new data and the new parity code are respectively stored. In this regard, it is naturally to be appreciated that the execution sequence of the steps 512 and 514 may be reversed.

In the example of FIG. 7A, after the old data is read from the drive SD #1, a write operation is initiated for the drive SD #6 prior to the drive SD #4 (because a disk rotation is to be elapsed before the initiation of the write operation for the SCSI drive SD #4). In consequence, the drive SD #6 is used to store the new parity code, whereas the drive SD #$ is adopted to store the new data. In short, the new data can be immediately written in the drive, whereas the new parity code can be written in the drive only after the computation of the parity code is finished.

Figure 7B:
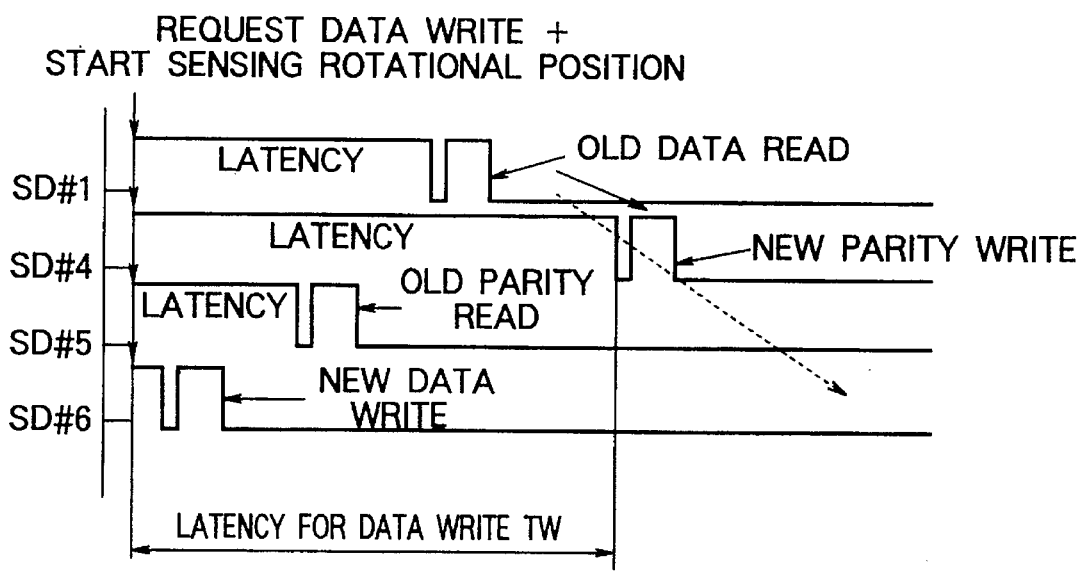

Moreover, in the example of FIG. 7B, after the old data is read from the drive SD #1, a write operation is commenced for the drive SD #6 prior to the drive SD #4. Consequently, the drives SD #4 and SD #6 are assigned to store therein the new parity code and the new data, respectively.

After the drives are decided for the write-after new data and parity code, the system conducts processing in accordance with the flowchart of FIG. 5. Next, the write operation will be described by reference to the operation timing chart of FIG. 7A.

The processor 20 indicates the drive interface circuit 28 to write the new data in the drive SD #4. The circuit 28 issues a write command via one of the paths 9 to the drive SD #4 according to the SCSI write procedure.

At the same time, the processor 20 instructs the circuit 28 to issue a read request for the old data to the drive SD #1,
a read request for the old parity code to the drive SD #5, and a write request for the new parity code to the drive SD #6.

In each of the drive to which the read or write command has been issued from the circuit 28, there are conducted a seek operation to an intra-SCSI address 44 sent from the circuit 28 and an access operation with latency. In the drive SD #4, when the access processing is completed and the write operation is ready, the circuit 14 reads the new data from the cache memory 7 and then transfers the data to the interface circuit 28. The new data is transferred therefrom via one of the paths 9 to the drive SD #4. When the new data is completely written in the drive SD #4, a write termination is reported from the drive SD #4 to the circuit 28. On receiving the report, the circuit 28 notifies the reception of the termination report to the processor 20 (step 516).

Even when the write operation of new data is completed in the SD #4, the new data is existing in the memory 7 and hence the renewal of the parity code can be executed according to the new data remaining therein.

Also in each of the drives SD #1 and SD #5, the access operation is completed, when it is possible to read the old data or the old parity code from the pertinent drive, the data item is obtained therefrom to be written in the memory 7 (steps 506 and 508). The processor 20 then issues an indication to a parity generator (PG) circuit 36 to conduct an exclusive OR operation between the new data in the memory 7 and the old data and parity code so as to produce an after-renewal parity code. Accordingly, the new parity code is created by generator 36 to be written in the memory 7 (step 518).

After the new parity code 7 is stored in the memory 7, when recognizing the termination of generation of the new parity code, the processor 20 indicates the interface circuit 28 to write the new parity code in the drive SD #6. The write operation is achieved in a manner similar to that adopted to write the new data in the drive SD #4 as described above.

In the drive SD #6, since a write command has already been issued thereto from the circuit 28, there have been commenced a seek operation according to the intra-SCSI address 44 indicated from the circuit 28 and an access operation (step 520). In a case where the new parity code thus generated has been stored in the memory 7 and the access processing has been completed in the drive SD #6, the adapter circuit 14 reads the new parity code from the memory 7 and then transfers the code to the circuit 28. From the circuit 28, the received new parity code is transferred via one of the paths 9 to the drive SD #6 (step 522).

When the new data and parity code are completely written in the respective drives SD #4 and SD #6, a write termination is reported from each of the drives to the circuit 28. On receiving the termination report therefrom, the circuit 28 notifies the termination to the processor 20.

In this situation, when the new data is to be deleted from the memory 7, the processor 20 sets in response to the report the flag 48 to "OFF (0)" in the table 40. Moreover, the processor 20 sets the invalidity flag of the logical address 45 of the before-write old data to "ON (1)", registers an address CCHHR 46 in the logical address 45 of the old data to the CCHHR field 46 of the logical address 45 of the new data, and then sets the invalidity flag of the new data to "OFF (0)".

In addition, when the new data written in the memory 7 is desired to be held therein, the processor 20 registers an address of the memory 7 where the new data is stored to the cache address 47 of the entry corresponding to the written data and then sets the cache flag 48 to "ON (1)". Moreover, according to the intra-SCSI address 44 of the logical group 102, the processor 20 replaces the parity drive number 50 and the dummy drive number 51 with the after-write SCSI drive number 43.

In the example of FIG. 7B, the processing can be accomplished also in the similar manner.

Although the write operation is achieved as described above, a method of sensing a disk rotational position in the write operation will now be described in detail.

Figure 8:
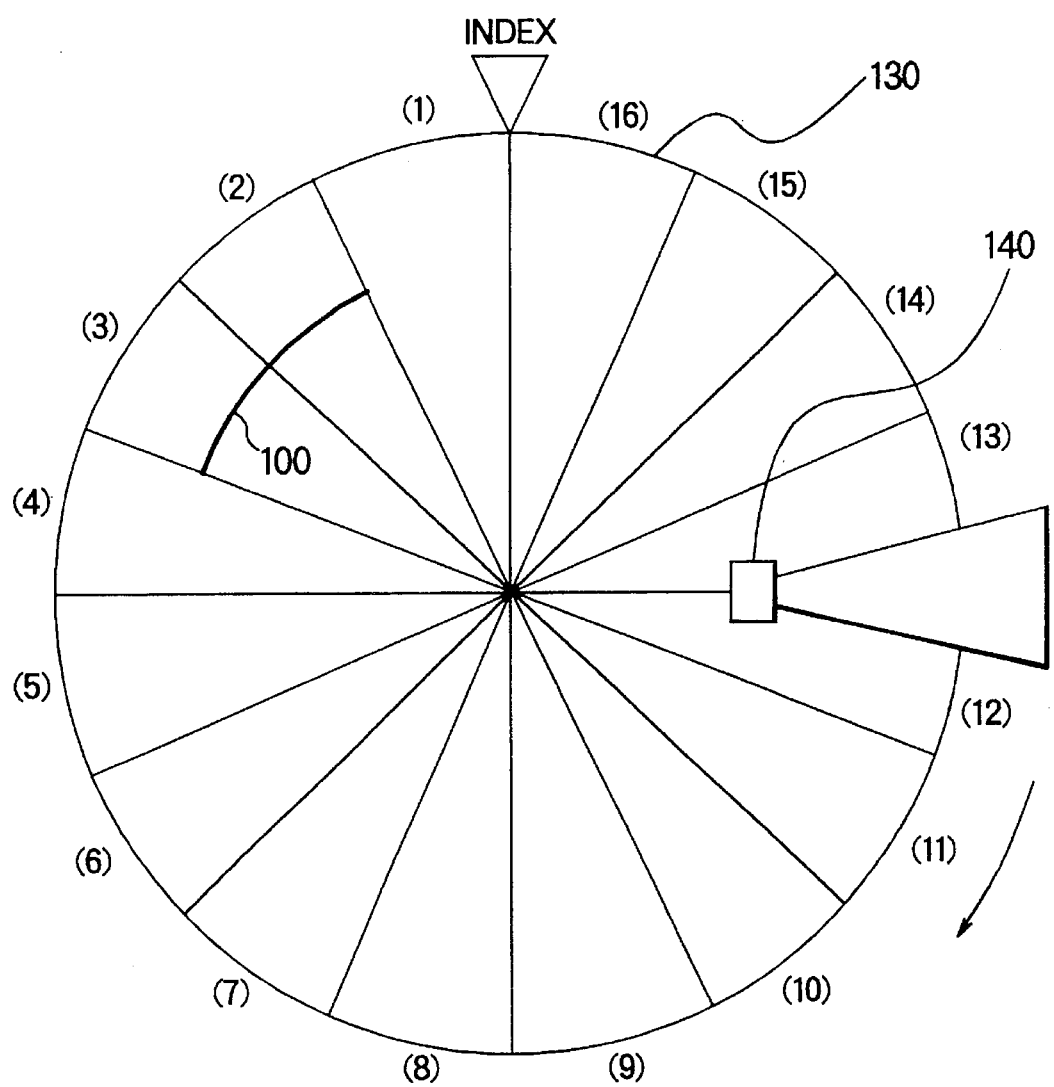
FIG. 8 is a diagram for explaining a method of sensing a disk rotational position.

According to the method of computing latency, a surface of the disk 130 is equally subdivided into sections beginning from an index thereof as shown in FIG. 8. In this example, the surface is partitioned into 16 equal sectors as can be seen from FIG. 8. Naturally, the number of sectors is not particularly limited. Furthermore, the disk 130 is assumed to be turned in a direction indicated by a curved arrow. The partitioned areas are assigned with numbers 1 to 16. In each area, the assigned number is written in a starting position thereof. In each drive, to compute the latency TW, an area number or a sector number just below the head 140 thereof is sent to the circuit 127. In the circuit 127, a difference between the sector number and a number (or an address) of the area 104 in which the pertinent data is stored is calculated to obtain the latency TW. Referring now to the example of FIG. 8, the latency computing method will be described. Assume that the head 140 is located at a start position of the area 13, the requested data exists in the areas 2 and 3, the start area of the request data is the area 2, and the period of time required for the disk 130 to make a rotation is 16.6 milliseconds (ms). Under these conditions, the latency TW is attained as follows.

(1) (area no. of head position—start area no. of requested data)>0, $$\begin{aligned}\text{Latency} &= \text{(total number of partitions} - \text{(area no. of head}\\ &\quad \text{position} - \text{start area no. of requested data))/total}\\ &\quad \text{number of partitions} \times \text{one rotation period of time}\\ &= (16 - (13 - 2))/16 \times 16.6 \text{ (ms)}\end{aligned}$$

In a case where the start area of the requested data is the area 15, (2) (area no. of head position—start area no. of requested data)≦0, $$\begin{aligned}\text{Latency} &= \text{(start area no. of requested data} - \text{area no. of head}\\ &\quad \text{position)/total number of partitions} \times \text{one rotation}\\ &\quad \text{period of time}\\ &= (15 - 13))/16 \times 16.6 \text{ (ms)}\end{aligned}$$

In this connection, the latency may be expressed with, in place of the period of time, the number of areas existing between the rotational position information representing the head position area on the disk surface to the start area of requested data.

Figure 9A:
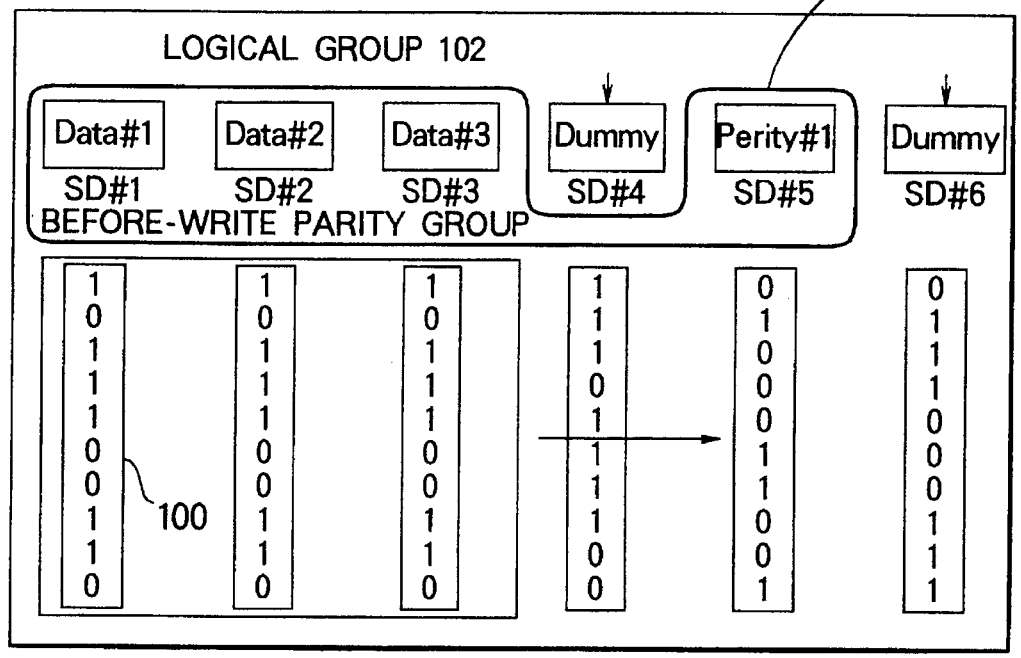
FIGS. 9A and 9B are diagram useful to explain data items in a parity group before and after a data renewal.
Figure 9B:
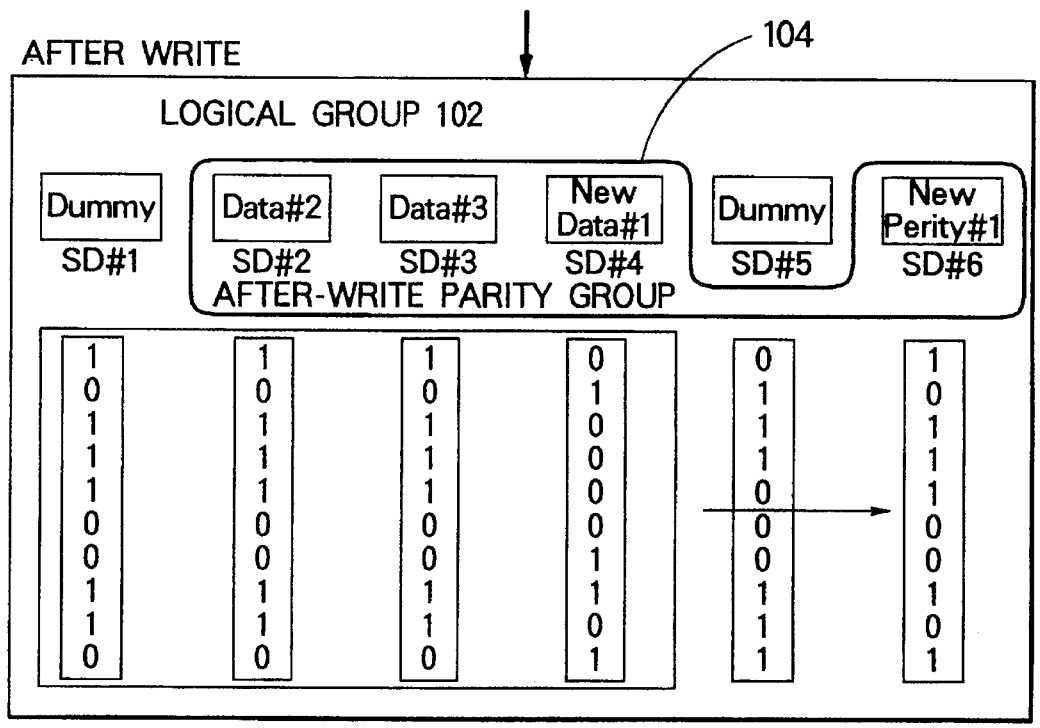

FIGS. 9A and 9B comparatively show flows of the before-write old data and parity code and the after-write new data and parity code in the example of FIG. 7A. The SCSI drives 12 denoted as SD #1 and SD #5 containing the old data and parity code prior to the write operation (FIG. 9A) are used after the write operation to store dummy data as can be seen from FIG. 9B. In this situation, although the old data and old parity code are still kept respectively in the drives SD #1 and SD #5, these data items are regarded as insignificant. It is to be noted that the constituent SCSI drives 12 of the parity group 104 related to creation of a parity code in the logical group 102 vary before and after the write operation.

Figure 23:
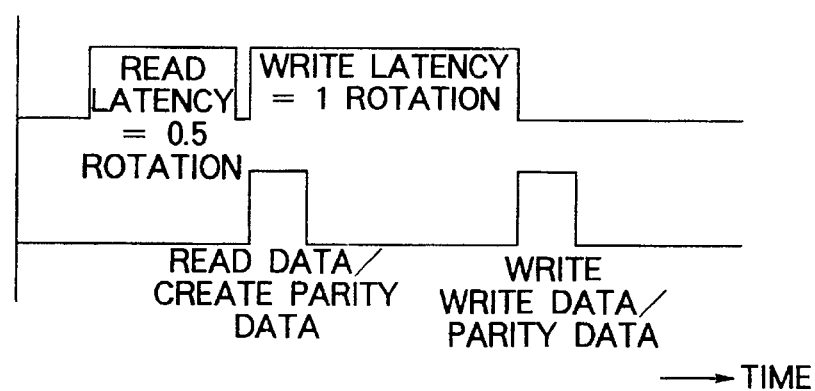
FIG. 23 is an operation timing chart showing data write processing in the RAID level 5 of FIG. 21.

In the write processing, the overall processing time thereof depends on the operation to write the new parity code. The after-write new data and parity code are written in the drives 12 containing dummy data, not in the drives in which the before-write old data and parity code are respectively stored. In consequence, after completion of the change of the parity code due to a data write operation, it is possible to write the new parity code thus renewed in the SCSI drive 12 available for the write operation at the earliest point of time among the drives 12. Consequently, in contrast with the conventional array disk system in which there are required the latency of 1.5 disk rotations on average for the write operation as shown in FIG. 23, the present system necessitates the latency of only one disk rotation on average, thereby decreasing the overall processing time for the write operation.

Next, description will be given of the processing method for a data read request.

On recognizing a read request command, the processor 20 references the address table 40 according to a CPU specification drive number and CCHHR (which are collectively called a CPU specification address herebelow) sent from the CPU 1. The processor 20 thereby conducts a conversion thereof to obtain a physical address related to the requested data and then checks the flag 48 to determine whether or not the data exists in the memory 7. In a case where the flag 48 is "ON" and hence the data is present therein (which indicates a cache hit), the processor 20 commences controlling the read operation to obtain the data from the memory 7. If the data is missing therein (which indicates a cache miss), the processor 20 starts controlling the pertinent drive 12 to read the data therefrom.

For the cache hit, the processor 20 translates the CPU specification address specified by the CPU 1 into an address of the memory 7 according to the table 40 and initiates reading the data from the memory 7. Specifically, under control of the processor 20, the cache adapter 24 reads the data from the memory 7. The circuit 24 achieves read and write operations of data from and in the memory 7 in response to indications from the processor 20. The circuit 24 monitors the state of the memory 7 and achieves an exclusive control operation for each of the read and write requests.

Data read by the circuit 24 is transferred under control of the data control circuit (DCC) 22 to the channel interface (CH IF) circuit 21. In the circuit 21, the data is subjected to a conversion in conformity of the protocol of the channel interface of the CPU 1, thereby conducting a speed adjustment for the operation speed of the interface. After the protocol conversion and the speed regulation are finished in the circuit 21, the switch 16 of the director 5 selects the external interface path 4 to transfer the data via the adapter 15 to the CPU 1.

On the other hand, for a cache miss, the processor 20 decides according to the table 40 a drive of the objective data and an address of the data therein and then instructs the circuit 28 to issue a read request to the pertinent drive 12. In the circuit 28, a read command is issued to a path 9 in conformity with the SCSI read procedure. In the drive 12 to which the read command is issued from the circuit 28, there are carried out a seek operation to an intra-SCSI address 44 and an access operation with latency. When the access operation is terminated in the drive 12, the data is transferred therefrom via the path 9 to the circuit 28.

The data is therefrom transferred to the adapter 14 on the SCSI drive side so as to write data in the memory 7. In this operation, the circuit 14 notifies to the processor 20 an event that the data is stored in the memory 7. According to the report, the processor 20 sets in the address table 40 the cache flag 48 of the entry 45 related to the CPU specification address of the read request issued from the CPU 1 to "ON (1)" and then registers to the cache address 47 the address of the memory 7 where the data is written. After conducting the operation to store the data in the memory 7, the cache flag 48 of the entry 45 associated with the data is set to "ON (1)" in the table 40 and the address 47 of the cache memory 7 is renewed therein. The processor 20 transfers the data to the CPU 1 in a manner analogous to that adopted for the cache hit.

In the description of the embodiment, a parity code is generated for data items having the same intra-SCSI address in the respective SCSI drives 12 constituting the logical drive group 10 and the parity code is written in a position having the same intra-SCSI address as that of each data item. According to the method, the address control operation can be advantageously effected only according to the drive numbers.

Figure 10:
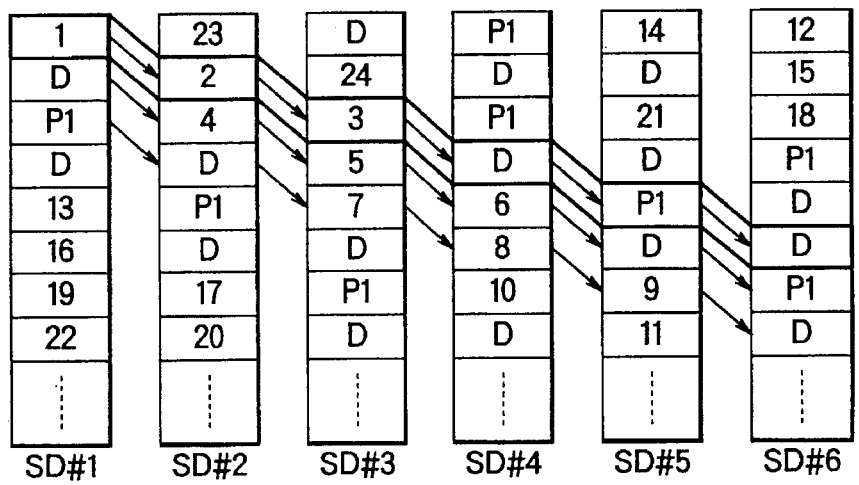
FIG. 10 is a diagram showing addresses of a logical group in a variation of the first embodiment.

However, the same operation can be achieved even when the data, the parity code, and the dummy data of the same logical group 102 are not assigned with the same intra-SCSI address 44. For example, as shown in FIG. 10, the advantageous operation can be accomplished even when the values of addresses thereof are shifted from each other by one. In such a case, for each data in the table 40, it is necessary to control not only the drive number but also the intra-drive address. The amount of the address shift need only be selected in consideration of difficulty or easiness of the overall system control. In this case, the present invention is applicable, even when the respective drives are coincident with each other with respect to the disk rotational position.

Figure 11:
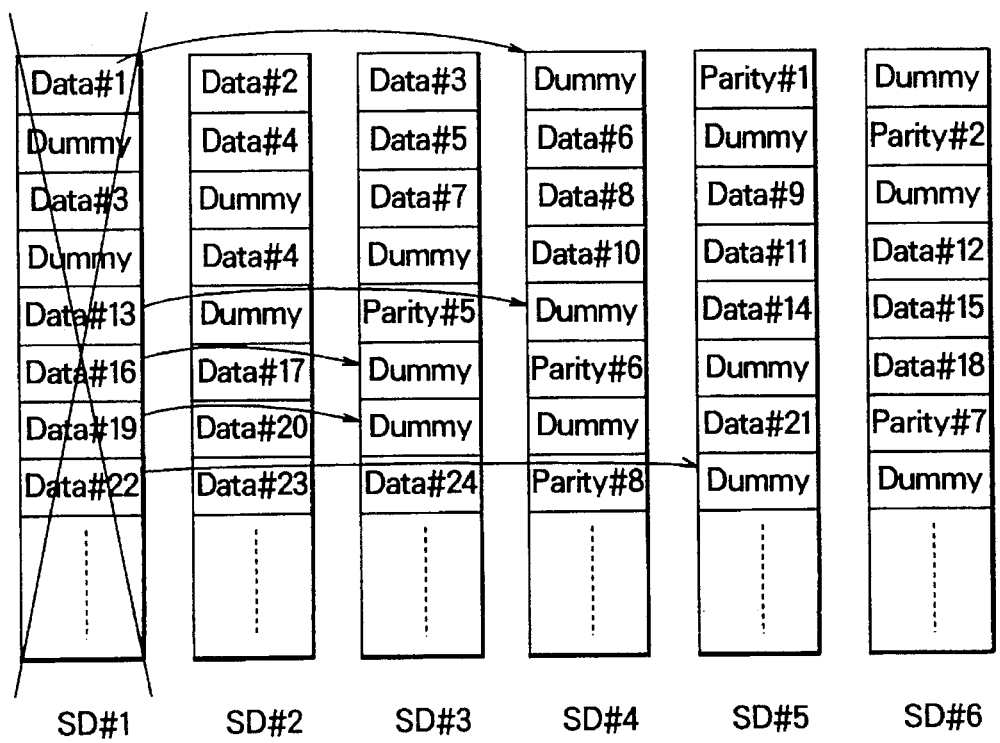
FIG. 11 is a diagram for explaining a data recovery operation in a second embodiment according to the present invention.
Figure 12:
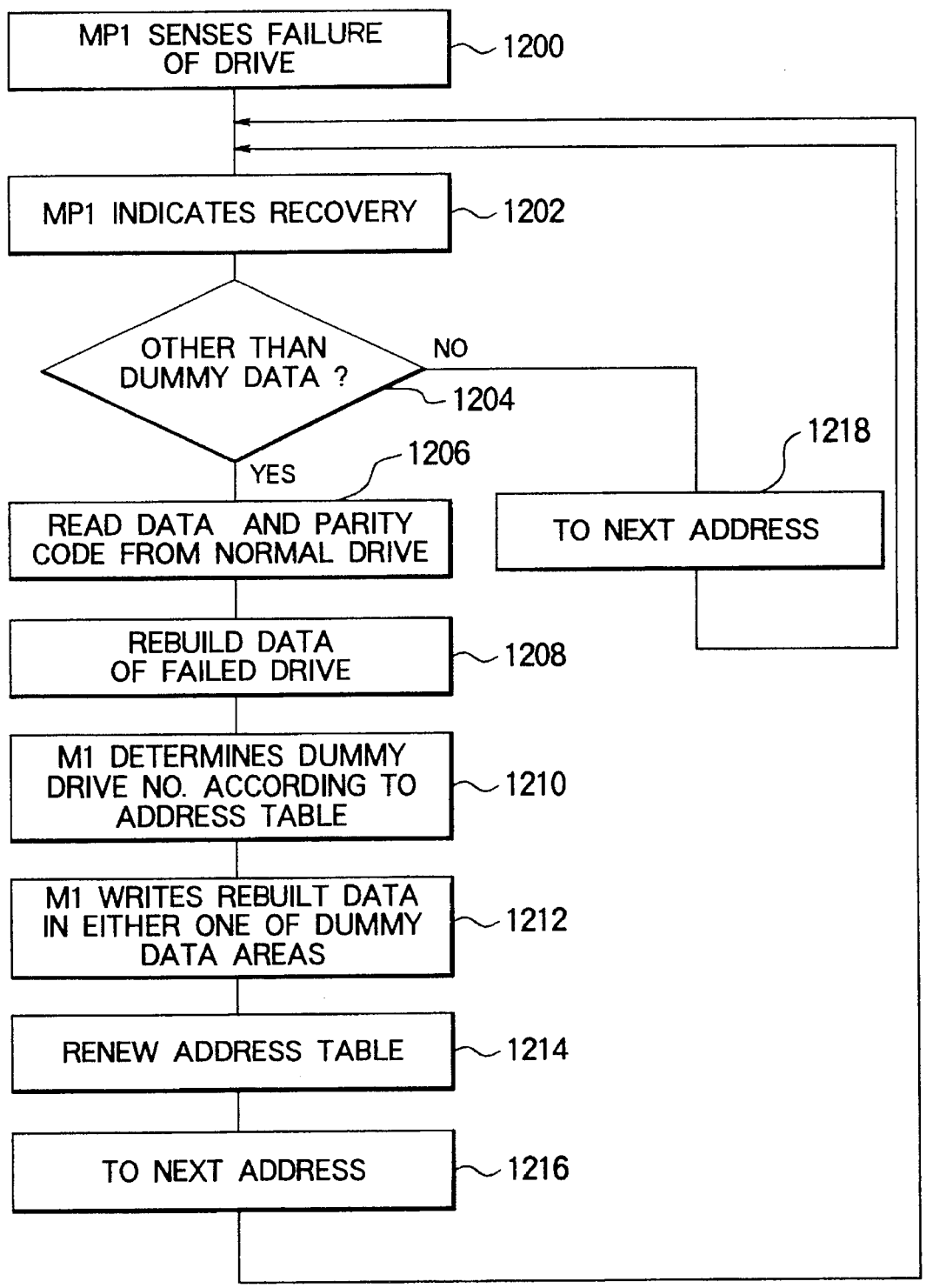
FIG. 12 is a flowchart showing a failure recovery operation in the example of FIG. 11.

Referring now to FIGS. 11 and 12, description will be given of a second embodiment according to the present invention.

In conjunction with the embodiment, there will be shown an example in which when a failure occurs in an SCSI drive 12 in the system of the embodiment 1, data of the failed drive is recovered and is stored in dummy data areas. In the respective drives 12 of the logical drive group 10, data items at an identical intra-SCSI address 44 of the drives 12 constitute the parity group 104. Concretely, as shown in FIG. 9A, a parity code #1 is generated by the parity generator 36 according to data items #1 to #3 respectively of the drives SD #1 to SD #3 and is then written in the drive SD #5. In this embodiment, there is adopted an odd parity system. Namely, the number of "1's" in the bits is counted so as to generate a parity code "0" or "1" when the number is odd or even, respectively (through an exclusive OR operation).

Assume that a failure occurs in the drive SD #1 as shown in FIG. 11. In this situation, the data #1 cannot be read therefrom.

To overcome the difficulty, as shown in FIG. 12, the processor 20 transfers the remaining data items #2 and #3 and the parity code #1 to the memory 7 and then indicates the circuit 36 to achieve an operation to rebuild the data #1 (step 1202). After the data is restored through the recovery processing (steps 1206 to 1208), the processor 20 recognizes according to the table 40 the dummy drive numbers 51 (SD #4 and SD #6) containing dummy data in association with the same intra-SCSI address 44 (DADR1; identical logical group) in the logical drive group. The processor 20 then writes the data #1 at a dummy data address of either one of the SD #4 and SD #6 (steps 1210 to 1212).

In the embodiment, the data #1 thus rebuilt through the recovery processing is written in an area of dummy data. Through the operation, the dummy data area can be used not only as an area to minimize the latency of the write operation as shown in the first embodiment but also as a spare area at an occurrence of a failure in a SCSI drive 12 to write the restored data.

After writing the rebuilt data #1 in the dummy data area in this fashion, the processor 20 deletes, from the dummy drive number field 51 of the table 40 in the memory 7 (FIG. 3), the drive number of the dummy drive in which the restored data is written and then copies the contents of the original entry 45 of the data #1 onto the entry 45 corresponding to the deleted drive number (step 1214).

As can be seen from FIG. 11, in the SCSI drive SD #1, there are stored dummy data, a parity code #3, and data items #13, #16, #19, and #22 in addition to the data #1. For the dummy data, it is unnecessary to execute the recovery processing to rebuild the data. For the parity code #3, the data items #7 to #9 are read respectively from the SCSI drives SD #3, SD #4, and SD #5 to create a new parity code to be stored in a dummy area of the drive SD #2 or SD #6. For the data #13, the parity code #5 and the data items #14 and #15 are read respectively from the drives SD #3, SD #5, and SD #6 so as to conduct the recovery processing with these items to restore the data, thereby writing the data in a dummy area of the drive SD #2 or SD #4. For the other data items, the recovery processing is carried out in a similar manner so as to write the rebuilt data items in dummy data areas of the logical drive group 10.

In this regard, after the restored data items of the drive SD #1 are completely written in dummy data areas of the drives SD #2 to SD #6, since the logical group 102 includes only one dummy data item, it is impossible to conduct the minimization of the disk latency described in conjunction with the first embodiment. Namely, there is achieved processing of the level 5 RAID which is a conventional array disk system. Furthermore, after the recovery data items of the drive SD #1 are thus written in the drives, when a failure occurs in either one of the drives SD #2 to SD #6, the recovery processing can be similarly executed for the data items of the failed drive so as to write the rebuilt data items in available dummy data areas, thereby continuing the inherent processing.

In the processing, when the dummy data areas are completely consumed in the logical group 102, the failed SCSI drive 12 is replaced with a normal SCSI drive 12. Thereafter, using the entire space of the normal drive 12 as dummy data areas, the logical group is re-constructed. Immediately after the substitution of the failed drive 12 for the normal drive 12, the dummy data areas are allocated to the particular drive 12. Consequently, the processing may possibly be set to a wait state due to unavailability of the drive, namely, the drive becomes to be a bottleneck of processing in some cases. In such situations, the advantageous effect of minimization of the latency of the first embodiment cannot be efficiently developed.

However, with the lapse of time, dummy data items are distributed to other SCSI drives 12 and hence the state of the SCSI drives is restored to the state before the failure. This gradually removes the problem of the bottleneck. In a case where the period of time to solve the problem is critical, the user can rebuild the data and parity codes in an SCSI drive which was used, at a first occurrence of a failure in an SCSI drive, as a normal disk to replace the failed drive and which failed due to a second occurrence of a failure. In this connection, dummy data items are not subjected to the recovery processing and hence areas thereof are kept allocated as dummy data areas.

In the embodiment, the recovery processing and the operation to write there built data in the dummy data areas are automatically carried out by the processor 20. This leads to an advantage as follows when compared with the operation at a failure of an SCSI drive in which rebuild data is written in an normal SCSI drive installed for the failed drive. Namely, according to the present invention, even when a failure occurs in an SCSI drive, it is not necessary for the user of the system to immediately replace the failed drive with a normal drive, which minimizes the load imposed on the user.

Figure 13:
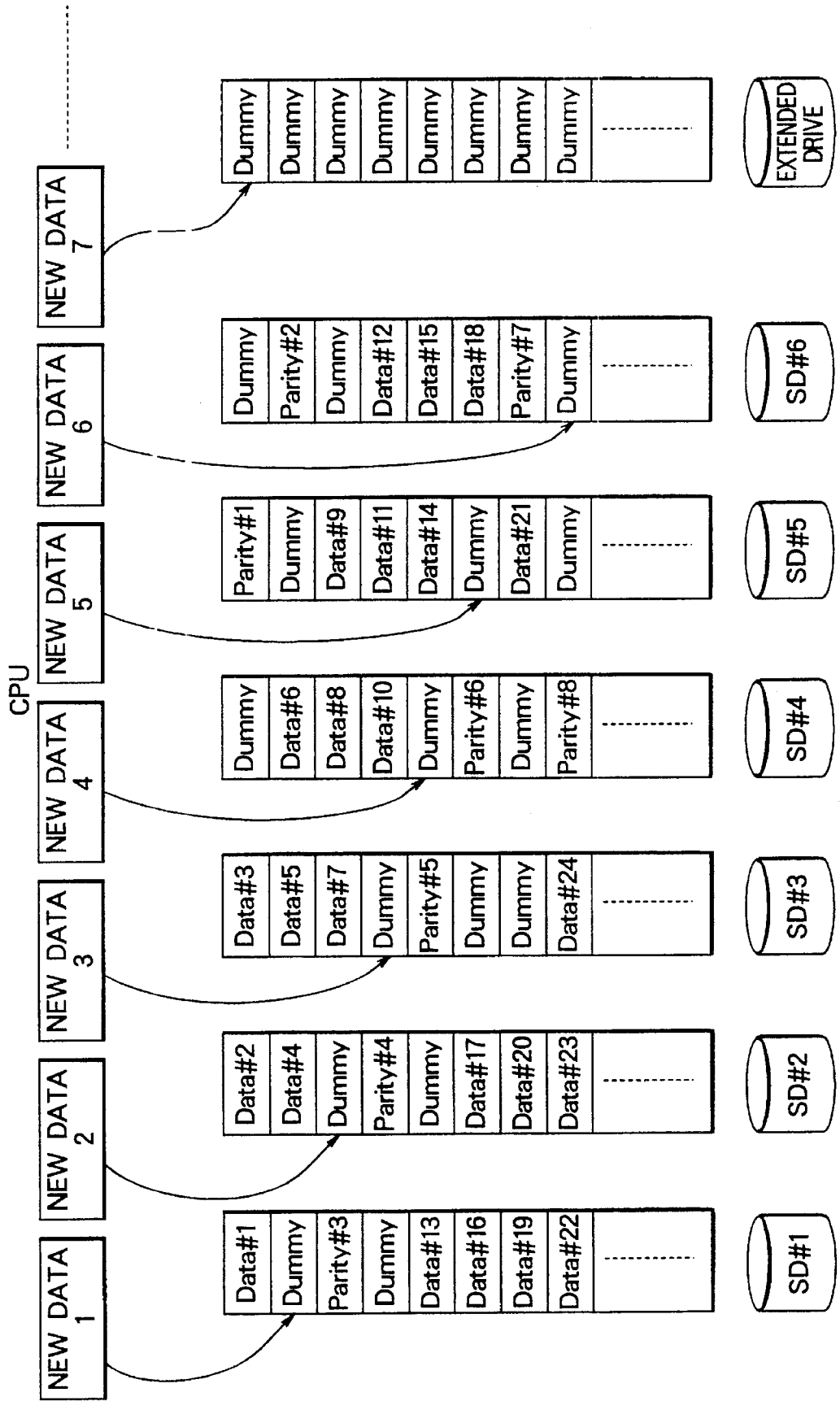
FIG. 13 is a diagram showing the configuration including an additional drive in a third embodiment according to the present invention.
Figure 14A:
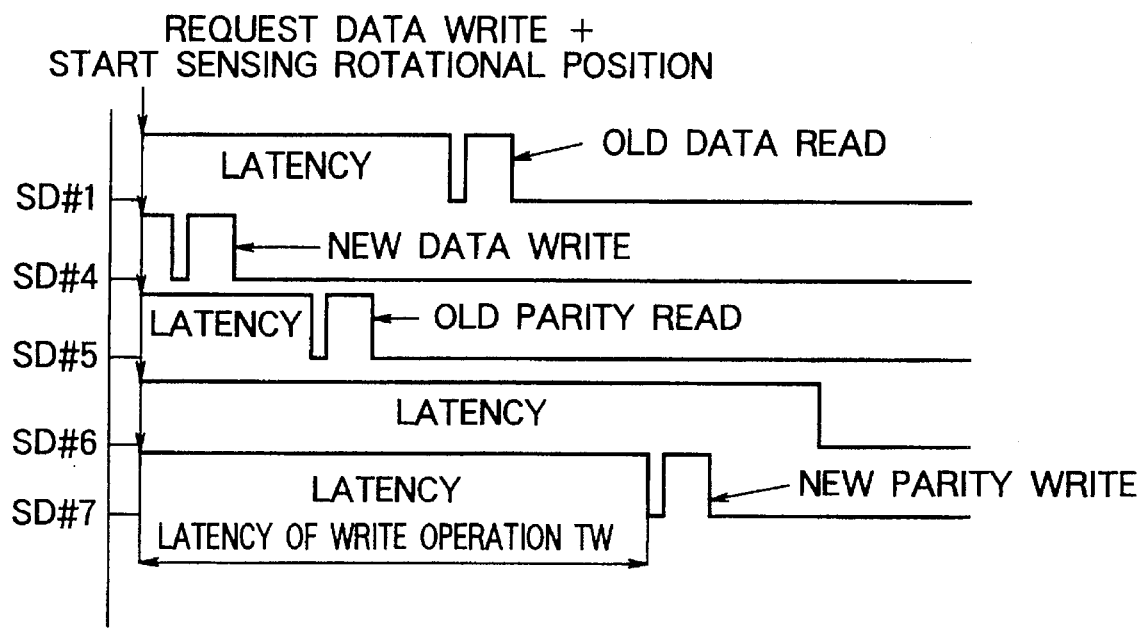
FIGS. 14A and 14B are diagrams showing timings of renewal processing in the example of FIG. 13.
Figure 14B:
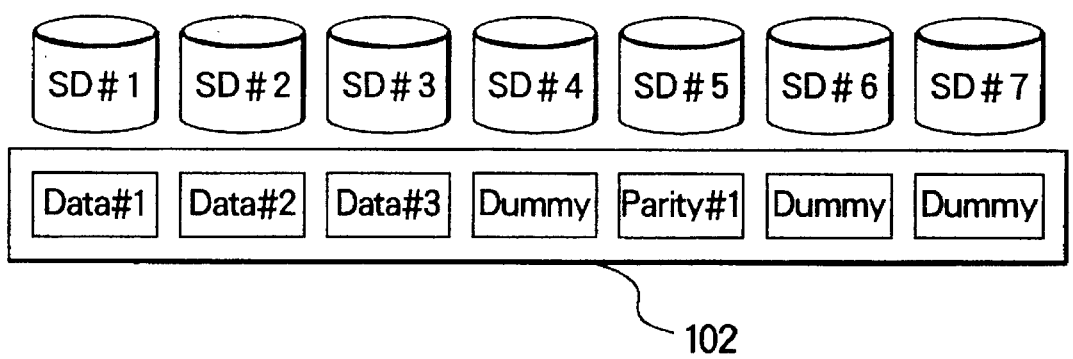
Figure 15:
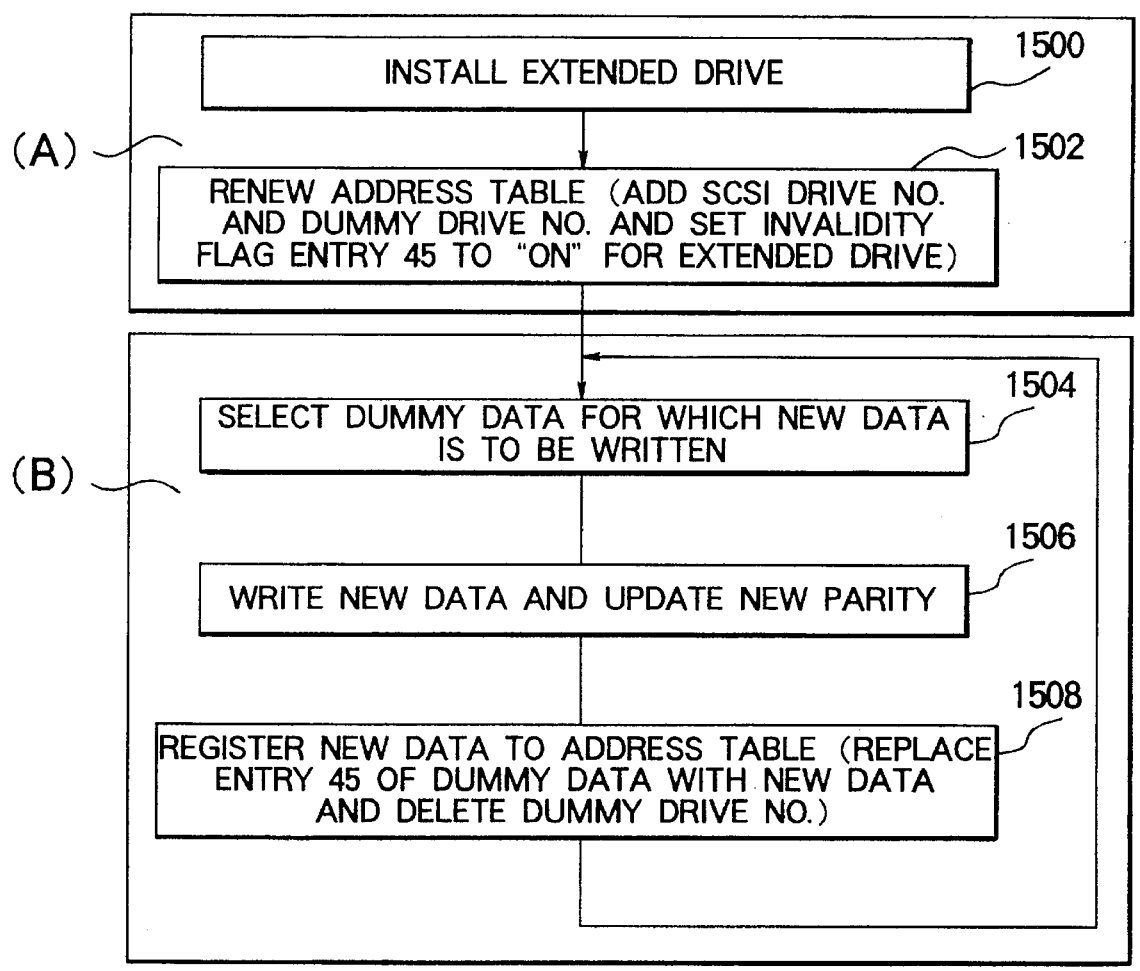
FIG. 15 is a flowchart showing a data write operation at expansion of the drive system.

Referring next to FIGS. 13 to 15, description will be given of a third embodiment according to the present invention.

In this embodiment, the number of dummy data items can be increased in the logical group 102 according to requirements of performance of the disk array system shown in the first and second embodiments. The requirements of performance of this example includes access performance to increase the read and write processing speed so as to decrease the processing time and reliability performance to cope with occurrences of failures. As a method of increasing the number of dummy data items, there is additionally installed, for example, an extended drive in which all areas are occupied by dummy data items as shown in FIG. 13.

FIG. 14B shows an example in which the number of dummy data items is set to three in the logical group 102. In this example, data items are written in SCSI drives 12 denoted as SD #1, SD #2, and SD #3, dummy data items are stored in SCSI drives 12 designated as SD #4, SD #6, and SD #7 (extended drive), and parity codes are loaded in an SCSI drive 12 indicated as SD #5.

Processing of a data renewal in this embodiment is different from the processing of the first embodiment in that the number of dummy drives is increased. Namely, to determine a drive in which a new parity code is to be written, there is employed the selection method of the first embodiment to decide an appropriate drive among the three drives. For the write operation of new data, there is chosen one of the remaining two drives in which the new data can be written at an earliest point of time. FIG. 14A shows an example of operation timings in the data write processing.

As shown in the example of this embodiment, there can be increased the number of dummy data items so as to use a greater number of drives to be selected in the write processing, thereby decreasing the overhead (latency) in the write operation. Moreover, at an occurrence of a failure, the data items related to the failure can be restored to be written in drives as described in conjunction with the second embodiment. Increasing the number of areas as the storage of the rebuilt data items leads to improvement of reliability of the system. For data requesting a high-performance processing, it is desirable to dispose a large number of dummy data items. In addition, in a logical drive group 10, there may be disposed groups having mutually different numbers of dummy data items.

The processor 20 can recognize the configuration of data, dummy data, and parity codes in the logical group 102 according to the address table 40 in the cache memory 7. Consequently, on receiving a read or write request issued from the CPU 1, the processor 20 checks the address table 40 to recognize the constitution of the logical group containing the objective data and then selects one of the processing procedures respectively of the embodiments 1 and 3, thereby executing the processing.

Incidentally, according to the present embodiment, it can be easily appreciated that the advantageous effect of the second embodiment is obtained. Moreover, although three dummy data items are used in the embodiment, the present invention is not restricted by the number of dummy data items.

In this embodiment, as can be seen from FIG. 13, on assumption that only dummy data items are stored in the extended drive, the number of dummy data items is increased for each identical intra-SCSI address 44 (identical logical group) of the logical drive group 10.

Referring next to FIG. 15, description will be given of a method of writing new data, after the number of dummy data items are increased in this manner, in a portion of the dummy data so as to increase the capacity or performance of the system. The flowchart of FIG. 15 includes processing (A) to add dummy data and processing to write new data in association with the expansion of capacity. In the processing (A), as shown in FIG. 13, an SCSI drive 12 is added as an extended drive to a logical drive group including six SCSI drives. As described above, the extended drive is assumed to contain only dummy data so as to increase the number of dummy data items for each identical intra-SCSI address 44 (identical logical group) of the logical drive group 10. In the table 40, the drive number assigned to the extended drive is additionally set to the drive number field 43 and is set to the dummy drive number field 51. Furthermore, the invalidity flag 49 is set to "ON (1)" in the logical address field 45 associated with each intra-SCSI address 44 for the added drive number, thereby registering each data as dummy data (step 1502).

Next, the processing (B) will be described. In a case where a request for increase in the storage capacity is issued from the user to the processor 20 of the ADC 2 for storage of data, the processor 20 checks the address table 40 to recognize addresses of three dummy data items related to the same intra-SCSI address 44 (identical logical group) of the logical drive group 10 and thereby selects one of the dummy data items stored in SCSI drives 12 not currently being used for other read or write processing (step 1504). Finishing the data selection, the processor 20 writes the new data in the drive at an address of the selected dummy data item in the same manner as for the ordinary write operation (step 1506). In this case, for the renewal of a parity code associated therewith, since dummy data is entirely "0" for the old data, it is unnecessary to read the old data from the storage.

In addition, in an operation to write the new parity code, there may be selected one of two dummy data items other than that used for the write operation of the new data, the selected item being available at an earlier point of time.

As described above, after writing the new data in the dummy data area, the processor 20 changes the logical address 45 related to the dummy data area in which the new data is written to indicate the new data and then deletes from the column 51 the drive number of the area in which the new data is written (step 1508). Thereafter, new data items are sequentially written in the storage in the similar fashion, thereby expanding the storage capacity.

The new data items are written in appropriate dummy data areas distributed to several dummy drives of the logical drive group 10 in this manner. In consequence, when writing new data items in the extended SCSI drive, the write operations of new data items do not concentrate on any particular SCSI drive. This resultantly improves the processing efficiency.

Referring now to FIG. 16, description will be given of a fourth embodiment according to the present invention.

In this embodiment, dummy data items can be shared among a plurality of logical drive groups 10. The disk array subsystem includes a plurality of logical drive groups 10 as shown in FIG. 16. According to the embodiment, to increase the number of dummy data items for data requesting a high-performance processing, there is not employed the method of the third embodiment in which the number of SCSI drives 12 is increased in the logical drive group 10. Namely, the method of allocating SCSI drives 12 to the logical drive groups 10 is altered for the above purpose. In the embodiment, a logical group is defined to include a parity group and dummy data corresponding thereto and a logical drive group 10 is assumed to include the logical group.

FIG. 16 shows a case where dummy data of an SCSI drive 12 denoted as SD #7 is shared between a logical group #1 and a logical group #2. The logical group #1 includes data #1 of the drive SD #1, data #2 of the drive SD #2, data #3 of the drive SD #3, dummy data of the drives SD #4 and SD #6, and parity data #1 of the drive SD #5. Dummy data of the drive SD #7 is shared between the logical groups #1 and #2, thereby forming an extended logical group #1.

The extended logical group #1 and the logical group #2 have three and two dummy data items, respectively. On the other hand, the logical group #2 includes a data item #4 in the drive SD #8, a data item #5 in the drive SD #10, data items #6 in the drive SD #11, dummy data items in the drives SD #7 and SD #9, and a parity code #2 in the drive SD #12.

In the extended logical group #1, there is carried out the control operation used in the embodiments 2 and 3. In the logical group #2, the control operation of the embodiments 1 and 2 is employed. The processor 20 can recognize, according to the address table 40 in the memory 7, the configuration of each pertinent logical group, namely, the constituent elements thereof including data items, a parity code, and dummy data items in SCSI drives 12 associated therewith. In the table 40, there is disposed a table indicating correspondences between CPU specification addresses denoted by the CPU 1 and logical groups. In consequence, for a read or write request issued from the CPU 1, the processor 20 can determine, according to the table 40, a logical group to which the requested data belongs.

In the embodiment described above, dummy data is shared among logical groups to configure an extended logical group. In the extended logical group, the user can arbitrarily specify any logical groups to share dummy data. In this situation, it is favorable that the dummy data is shared among logical drive groups 10 not to cause conflicts between read or write requests from the CPU 1.

In this connection, disposition of a spare area for each parity group leads to an advantageous effect of simplification of the control operation. However, the area need not be necessarily assigned for each parity group depending on uses of the areas for the following reasons. Namely, in place of such a spare areas corresponding to each parity group, there may be prepared in each drive a spare area available for a plurality of parity groups. In an operation to write the new data and parity code in drives, there are selected two drives other than the drive to which the before-modification or old parity group belongs such that the new data and parity codes are written in two spare areas respectively of the selected drives. The areas respectively of the old data and parity code are thereafter used as spare areas. According to this method, there is obtained an advantage of minimization of the absolute quantity of the spare areas.

Referring now to FIGS. 17 to 20, description will be given of a fifth embodiment according to the present invention.

Figure 18:
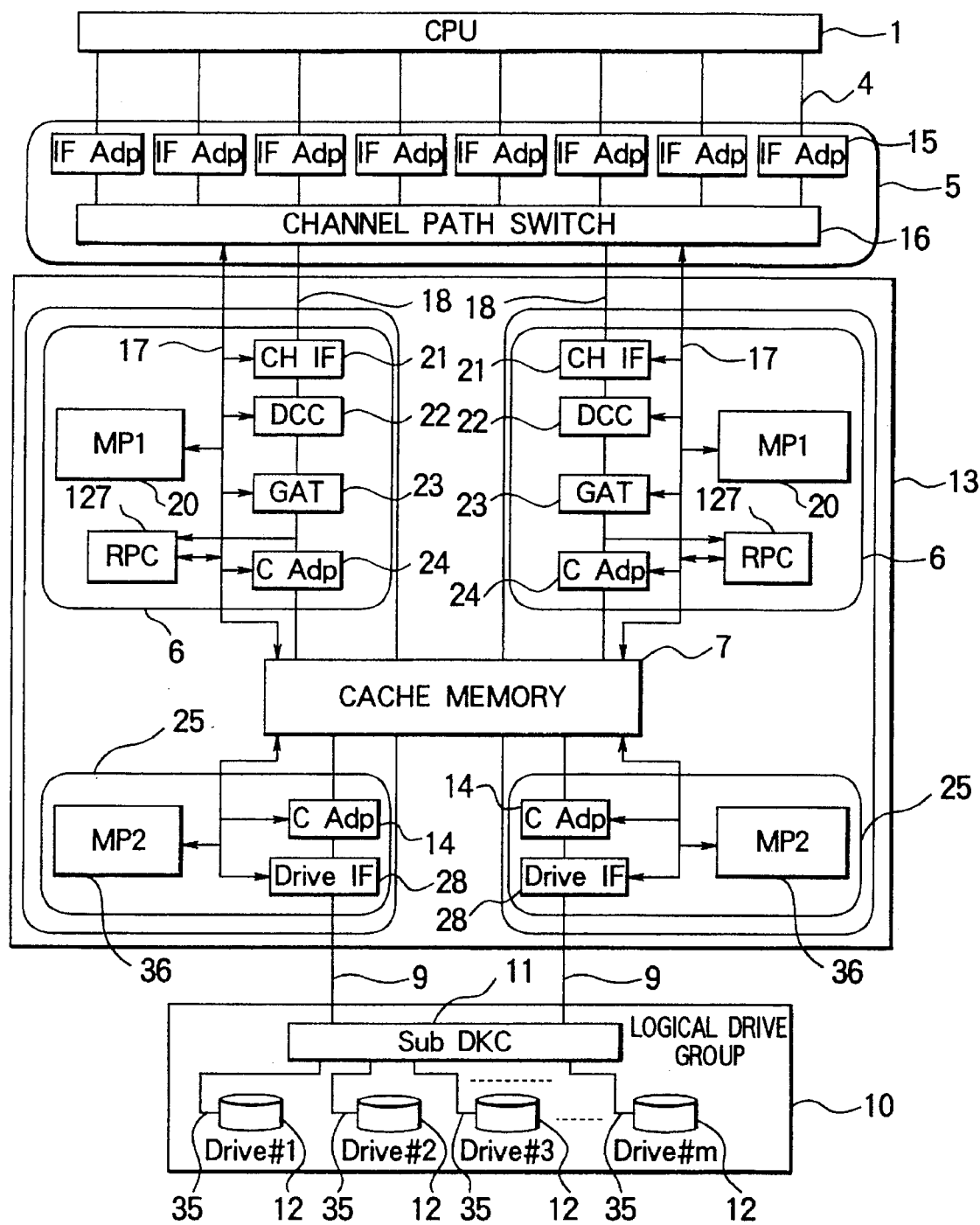
FIG. 18 is a diagram showing the internal structure of a cluster of the fifth embodiment.

In this embodiment, a subordinate disk controller (DKC) 11 is disposed for each logical drive group 10 as shown in FIGS. 17 and 18. In the controller 11, as can be seen from FIG. 19, there are disposed the address table 40 in the cache memory 7 like in the first to fourth embodiments, a parity generator (PG) 36, a sub-cache memory 32, and a microprocessor (MP) 29 controlling these constituent elements. This embodiment employees a data processing procedure similar to that described in conjunction with the first and second embodiments. Consequently, only procedural portions different from those of the first to fourth embodiments will be described.

Figure 19:
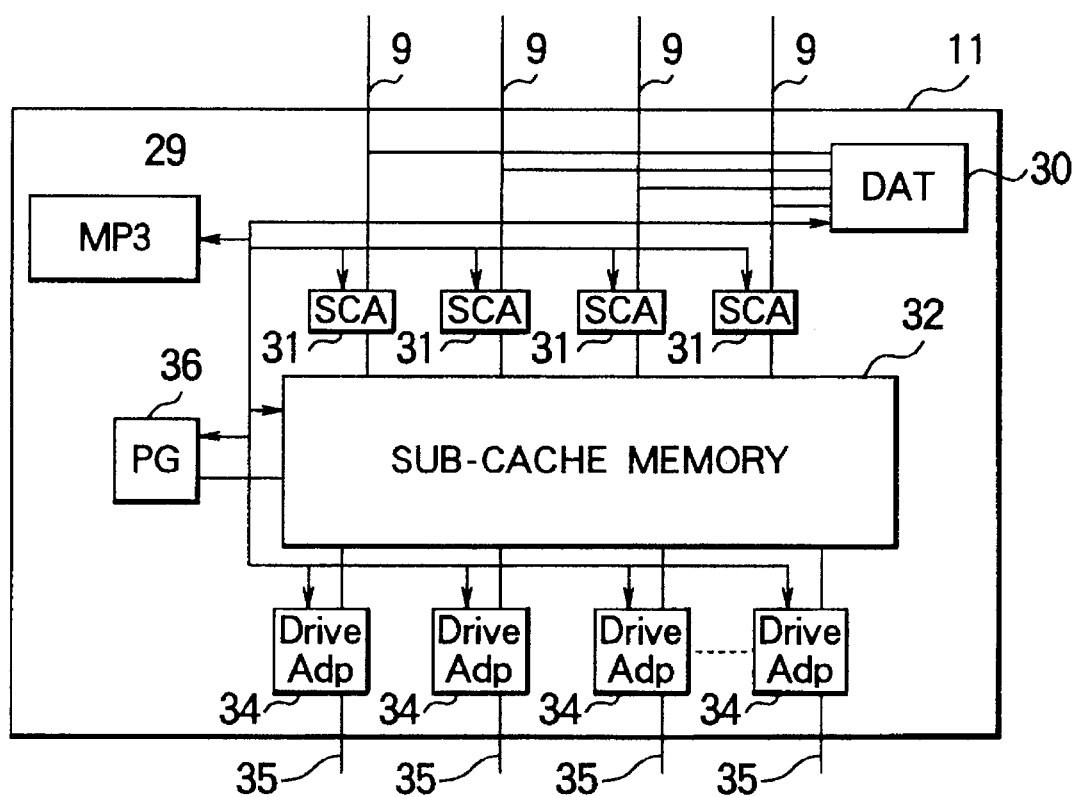
FIG. 19 is a diagram showing the internal configuration of a subordinate DKC of the fifth embodiment.
Figure 21:
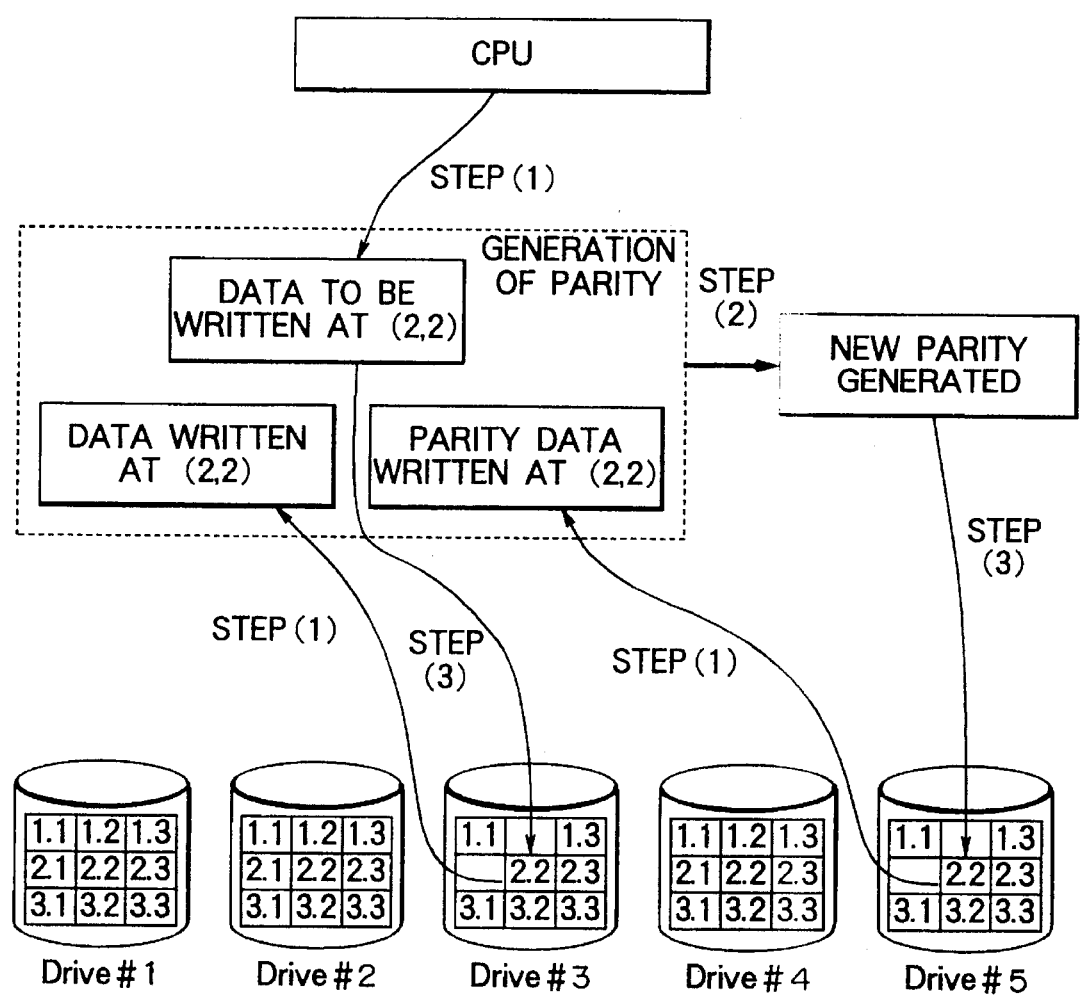
FIG. 21 is a diagram useful to explain the data renewal operation of a mainframe system using the level 5 RAID in the prior art.
Figure 22:
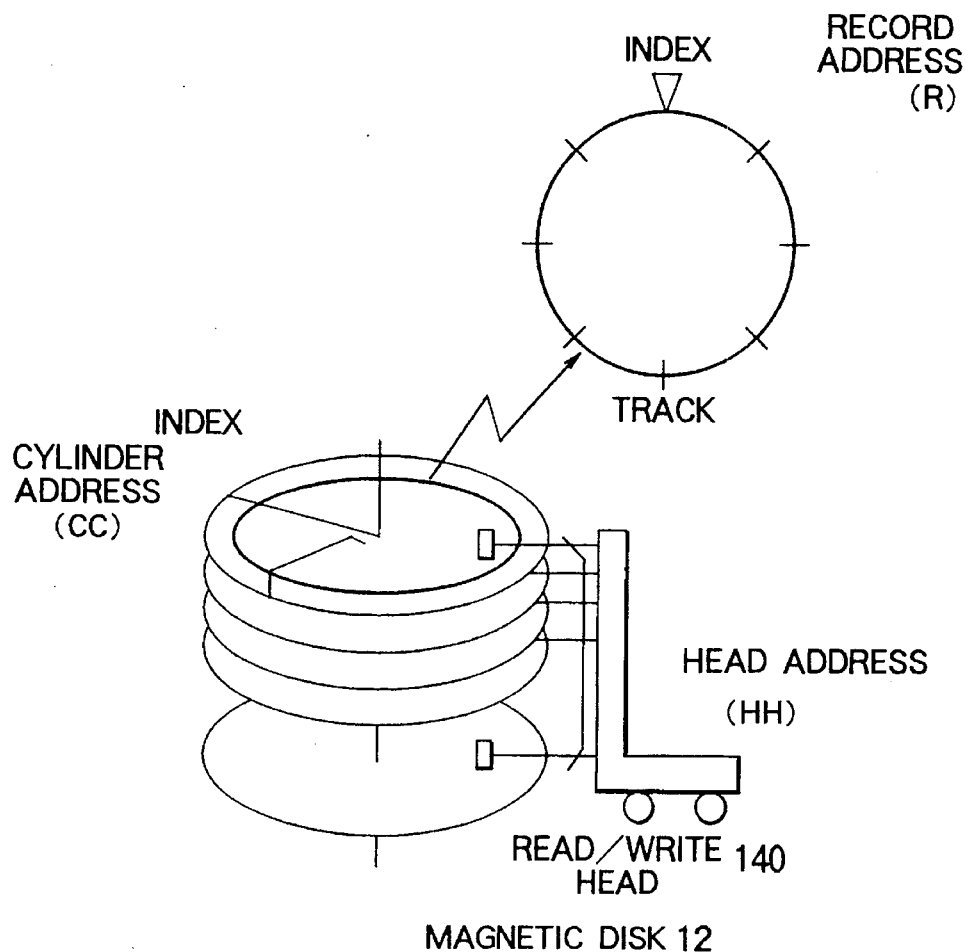
FIG. 22 is a diagram for explaining internal addresses of drives in the example of FIG. 21.

In this embodiment, as shown in FIG. 19, the table 40 in the memory 7 of the above embodiments is loaded in a data address table (DAT) in the controller 11. As for the table format and function, the tables 30 and 40 are identical to each other. They are different from each other in that the SCSI drive addresses for data storage positions are restricted to those belonging to the logical drive groups 10 and the table 30 is constructed in an exclusives memory in which write and read data items are not held. In consequence, in place of the table 30, the table 40 of FIG. 3B will be appropriately referenced in, the following description. In the controller 2, a GAT 23 is used to check the CPU specification address indicated from the CPU 1 only to decide one of the logical drive groups 10 to which a position indicated by the address belongs.

In a particular area of the memory 7, there is stored a logical group table (LGT) 60 as shown in FIG. 20. Using the table 60, a logical group address 61 can be decided in association with the CPU specification drive number 41 and the CCHHR 46 denoted by the CPU 1. Furthermore, in a case where data corresponding to the CPU specification address exists in the memory 7, an address of the data in the memory 7 can be registered to a cache address field 47 of the table 60. Also disposed in the table 66 is a cache flag 48 to be set to "ON (1)" or "OFF (0)" when the data represent or missing therein. In the initial setting operation of the system, the user reserves an area according to an available capacity of the storage space. In the operation, the processor 20 of the controller 2 allocates the logical drive groups 10 according to the table 60.

In this situation, the processor 20 registers to the table 60 an area corresponding to the CPU specification address denoted by the user for area reservation. Consequently, in an actual read or write operation, the GAT 23 can recognize according to the table 60 a logical drive group 10 associated with the CPU specification address designated by the CPU 1.

In a data read operation, the GAT 23 determines a logical drive group 10 according to the LGC and then reports the group 10 to the processor 20. In response thereto, the processor 20 indicates the circuit 28 to issue a read request to the group 10. On receiving the indication, the circuit 28 supplies the controller 11 of the group 10 with a read request and a CPU specification address denoted by the CPU 1. In the controller 11, the processor 29 receives the read request command and the address. Like in the first embodiment, referencing the table 30, the processor 29 translates the address received from the circuit 28 into a physical address of the data in the logical group 10. The processor 29 decides therefrom an SCSI address (an SCSI drive number and an intra-SCSI address). After the address is determined, the processor 29 issues a read request to the pertinent drive 12.

On receiving the read request from the processor 29, the drive 12 conducts a seek operation according to the intra-SCSI address and then a period of time of the disk latency is elapsed for the data access timing. When the data access is ready, the drive 12 immediately transfers the data to a drive adapter (DRVE Adp) circuit 34. The circuit 34 then= writes the data in the memory 32. After the write operation is terminated, the circuit 34 notifies the termination to the processor (MP3) 29. The processor 29 then sets the cache flag 48 to "ON (1)" in the logical address field 45 of the table 30 associated with the data. Thereafter, when a read or write request is issued for the data of which the flag 48 is "ON (1)", the pertinent processing is achieved in the subordinate cache memory 32.

Like in the first embodiment, completely achieving the renewal of the table 30, the processor 29 sends a report to the circuit 28 in the controller 2 to notify possibility of the data transfer. On receiving the report, the circuit 28 notifies the condition to the processor 20. In response thereto, the processor 20 indicates, when it is possible to write data in the memory 7, the circuits 28 to transfer data from the controller 11. On receiving the indication from the processor 20, the circuit 28 issues a read request to the processor 29 of the controller 11. According to the request, the processor 29 indicates a sub-cache adapter (SCA) 31 to read the data from the sub-cache 32. The adapter 31 actually reads the data therefrom to transfer the data to the circuit 28. After the data is received by the circuit 28, the processing is carried out in the same manner as for the first and second embodiments.

On the other hand, in an operation to write data in a drive, the processor 20 first decides a logical drive group 10 for the write operation and then indicates the circuit 28 to issue a write request to the processor 29 of the group 10. On receiving the request, the processor 29 writes the data in the cache 32 and then senses rotational positions in a group of SCSI drives 12 by the controller 11 according to the flowchart of FIG. 5 like in the first to fourth embodiments. After sensing the positions, the processor 29 determines one of the drives 12 for the write operation. Thereafter, the processing is achieved in the same fashion as for the first to fourth embodiments. In this embodiment, there can be obtained an advantageous effect similar to that attained by the first to fourth embodiments.

In conjunction with the embodiments above, description has been given of a system adopting magnetic disk devices by way of example. However, the present invention is not restricted by those embodiments. Namely, according to the present invention, the similar effect can be developed in a storage system employing other rotating recording media such as optical disk devices.

In accordance with the embodiments of the present invention, since the wait time due to the disk latency can be minimized in a data renewal, the write processing can be conducted at a high speed and there can be increased the number of input and output operations per unitary time. In addition, at an occurrence of a failure in an SCSI drive, it is unnecessary to immediately replace the drive with a normal drive, which consequently reduces the load imposed on the system user. Moreover, thanks to the simplified address control operation, the drive system can be easily expanded. In addition, a spare SCSI drive which is not accessed in an ordinary state can be used to improve the system performance, namely, to decrease the disk latency; consequently, the resources of SCSI drives can be efficiently operated.

While particular embodiments of the invention have been shown and described, it will be obvious to those skilled in the art that various changes and modifications may be made without departing from the present invention in its broader aspects.

I claim:

1. A method of renewing data in a storage device having a plurality of disk drives, said storage device storing therein data groups each thereof including a plurality of data segments and at least one error correcting code generated from the plural data segments, and the plural data segments and corresponding at least one error correcting code of a data group are distributed to said plurality of disk drives to be stored therein, respectively, the method comprising the steps of:

generating, when rewriting with a new data segment one of the plural data segments in one of the data groups, a new error correcting code for said one data group; and storing in a distributed fashion the new data item and the new error correcting code, in respective spare areas each thereof being allocated in each of extra disk drives in said plurality of disk drives which extra disk drives are provided in addition to disk drives necessary at minimum to write therein a data group in a distributed manner, the new data segment and the new error correcting code being written in the spare areas respectively of the extra disk drives which are other than the disk drives in areas of which a data segment to be renewed and an old error correcting code related to the data group to be renewed were written, further including the steps of:

writing each of data segments of a data group to be used to generate a corresponding error correcting code in discrete disk drives at an identical physical address;

writing the error correcting code in a different disk drive at said identical physical address; and determining the spare areas in drives at said identical physical address, the drives for said spare areas being other than the drives in which the data segments and the error correcting code are written.

2. In a method of renewing data in a disk array system including a disk apparatus having a plurality of disk drives storing therein data segments, and a control device for controlling data storing operations of the disk apparatus in response to data input and output requests from an external unit, comprising the steps of:

selecting a plurality of data segments from the stored data segments and generating a parity code therefrom;

forming a unit of a parity group including the parity code and associated data segments; and storing in the disk drives the parity code and associated data segments;

the improvement comprising the steps of:

distributing data transferred from said external unit as a unit of a read or write operation to respective storage areas of said disk drives in a form of data segments;

selecting a plurality of data segments from the data segments thus distributively stored, generating a parity code therefrom, forming a unit of a parity group including the parity code and associated data segments, and assigning a plurality of dummy data segments to the parity group; and holding the plural dummy data segments of a parity group in discrete disk drives other than disk drives in which the parity code and associated data segments are written, and further including the steps of:

storing parity groups each including data items from which a parity code is created and the parity code and spare write areas in mutually different drives;

forming a set of the drives as a logical drive groups;

writing, in the logical drive group, the respective data items in the different drives at an identical physical address and the parity code in a further different drive at an address identical to the physical address of the data items related to the creation of the parity code; and writing the dummy data items like the data items and the parity code in drives different from the drives in which the data items and the parity code are written, the dummy data items being written at an address identical to that of the data items and the parity code.

3. A disk array system including a disk apparatus having a plurality of disk drives storing therein data segments of a plurality of parity groups, and a control device for controlling data storing operation of the disk apparatus in response to a data input and output request from an external unit, said control device selecting a plurality of data segments from the stored data segments, generating a parity code therefrom, forming a unit of one parity group including a set of the parity code and associated data segments, and storing for a parity group the parity code and associated data segments of the parity group in the disk drives, wherein the control device comprises:

means for distributing data transferred from the external unit as a unit of a read or write operation to respective storage areas of the disk drives to store the data therein in a form of data segments;

means for selecting a plurality of data segments from the data segments thus distributively stored, generating a parity code therefrom, forming a unit of one parity group including the parity code and the data segments, and assigning a plurality of dummy data segments to the parity group; and means for writing the plural dummy data segments of the parity group in discrete disk drives other than disk drives in which the parity code and associated data segments are written, the disk drives which store a parity group and the disk drives which store associated dummy data segments forming a logical drive group, wherein the control device further includes an address translation table, and the control device translates, in response to a write request from the upper-level device, a data address specified as a destination of the write request by the upper-level device into a physical address of the dummy data item in the parity group and writes the physical address in the table.

4. A disk array system including a disk apparatus having a plurality of disk drives storing therein data segments of a plurality of parity groups, and a control device for controlling data storing operation of the disk apparatus in response to a data input and output request from an external unit, said control device selecting a plurality of data segments from the stored data segments, generating a parity code therefrom, forming a unit of one parity group including a set of the parity code and associated data segments, and storing for a parity group the parity code and associated data segments of the parity group in the disk drives, wherein the control device comprises:

means for distributing data transferred from the external unit as a unit of a read or write operation to respective storage areas of the disk drives to store the data therein in a form of data segments;

means for selecting a plurality of data segments from the data segments thus distributively stored, generating a parity code therefrom, forming a unit of one parity group including the parity code and the data segments, and assigning a plurality of dummy data segments to the parity group; and means for writing the plural dummy data segments of the parity group in discrete disk drives other than disk drives in which the parity code and associated data segments are written, the disk drives which store a parity group and the disk drives which store associated duty data segments forming a logical drive group, wherein the control device further includes:

a rotational position sensing circuit responsive to an issuance of a write request from the upper-level device for sensing rotational positions in a logical drive group including drives containing old data items at physical addresses corresponding to addresses specified as write destinations by the upper-level device, the sensing operation being conducted for each of the drives containing the old data items and the old parity code and dummy data items to be renewed in the logical drive group;

means for computing latency according to information of a rotational position thus sensed for each of the drives; and means for deciding in the plural drives containing the dummy data items, according to information of the rotational position and latency of each of the drives, drives and physical addresses of dummy data items for storage of the new data items of the logical group.

5. A disk array system including a disk apparatus having a plurality of disk drives storing therein data segments of a plurality of parity groups, and a control device for controlling data storing operation of the disk apparatus in response to a data input and output request from an external unit, said control device selecting a plurality of data segments from the stored data segments, generating a parity code therefrom, forming a unit of one parity group including a set of the parity code and associated data segments, and storing for a parity group the parity code and associated data segments of the parity group in the disk drives, wherein the control device comprises:

means for distributing data transferred from the external unit as a unit of a read or write operation to respective storage areas of the disk drives to store the data therein in a form of data segments;

means for selecting a plurality of data segments from the data segments thus distributively stored, generating a parity code therefrom, forming a unit of one parity group including the parity code and the data segments, and assigning a plurality of dummy data segments to the parity group; and means for writing the plural dummy data segments of the parity group in discrete disk drives other than disk drives in which the parity code and associated data segments are written, the disk drives which store a parity group and the disk drives which store associated dummy data segments forming a logical drive group, wherein the control device further includes:

means responsive to an occurrence of a failure in a disk drive of a logical drive group, for conducting a recovery processing and rebuilding data segments and parity codes stored in the failed disk drive by using data of disk drives other than said failed disk drive;

means for writing the rebuilt data segments and parity codes in the spare areas of the disk drives other than said failed disk drive; and means for replacing the failed drive with a normal disk drive and re-constructing a new logical drive group on assumption that the normal disk drive has only spare areas containing dummy data segments, at a time of re-starting processing.

6. A disk array system including a disk apparatus having a plurality of disk drives storing therein data segments of a plurality of parity groups, and a control device for controlling data storing operation of the disk apparatus in response to a data input and output request from an external unit, said control device selecting a plurality of data segments from the stored data segments, generating a parity code therefrom, forming a unit of one parity group including a set of the parity code and associated data segments, and storing for a parity group the parity code and associated data segments of the parity group in the disk drives, wherein the control device comprises:

means for distributing data transferred from the external unit as a unit of a read or write operation to respective storage areas of the disk drives to store the data therein in a form of data segments;

means for selecting a plurality of data segments from the data segments thus distributively stored, generating a parity code therefrom, forming a unit of one parity group including the parity code and the data segments, and assigning a plurality of dummy data segments to the parity group; and means for writing the plural dummy data segments of the parity group in discrete disk drives other than disk drives in which the parity code and associated data segments are written, the disk drives which store a parity group and the disk drives which store associated dummy data segments forming a logical drive group, wherein the control device further includes a table for controlling configuration of the data items, the parity code, and the dummy data items in a logical drive group to which the drives of the parity group belong.

7. A disk array system including a disk apparatus having a plurality of disk drives storing therein data segments of a plurality of parity groups, and a control device for controlling data storing operation of the disk apparatus in response to a data input and output request from an external unit, said control device selecting a plurality of data segments from the stored data segments, generating parity code therefrom, forming a unit of one parity group including a set of the parity code and associated data segments, and storing for a parity group the parity code and associated data segments of the parity group in the disk drives, wherein the control device comprises:

means for distributing data transferred from the external unit as a unit of a read or write operation to respective storage areas of the disk drives to store the data therein in a form of data segments;

means for selecting a plurality of data segments from the data segments thus distributively stored, generating a parity code therefrom, forming a unit of one parity group including the parity code and the data segments, and assigning a plurality of dummy data segments to the parity group; and means for writing the plural dummy data segments of the parity group in discrete disk drives other than disk drives in which the parity code and associated data segments are written, the disk drives which store a parity group and the disk drives which store associated dummy data segments forming a logical drive group, wherein the control device further includes a table for controlling configuration of the data items, the parity code, and the dummy data items in a logical drive group to which the drives of the parity group belong, and wherein the control device further includes a table for controlling allocation of data items, a parity code, and dummy data items constituting a logical group.

8. A disk array system including a disk apparatus having a plurality of disk drives storing therein data segments of a plurality of parity groups, and a control device for controlling data storing operation of the disk apparatus in response to a data input and output request from an external unit, said control device selecting a plurality of data segments from the stored data segments, generating a parity code therefrom, forming a unit of one parity group including a set of the parity code and associated data segments, and storing for a parity group the parity code and associated data segments of the parity group in the disk drives, wherein the control device comprises:

means for distributing data transferred from the external unit as a unit of a read or write operation to respective storage areas of the disk drives to store the data therein in a form of data segments;

means for selecting a plurality of data segments from the data segments thus distributively stored, generating a parity code therefrom, forming a unit of one parity group including the parity code and the data segments, and assigning a plurality of dummy data segments to the parity group; and means for writing the plural dummy data segments of the parity group in discrete disk drives other than disk drives in which the parity code and associated data segments are written, the disk drives which store a parity group and the disk drives which store associated dummy data segments forming a logical drive group, wherein the control device further includes, for each logical drive group to which the drives of the parity group belongs, a table for address translation, a rotational position sense circuit, a parity generating circuit, a cache memory, and a microprocessor controlling the above constituent elements of the control device.

* * * * *